United States Patent
Nishimura et al.

(10) Patent No.: US 6,713,830 B2
(45) Date of Patent: Mar. 30, 2004

(54) MAGNETORESISTIVE ELEMENT, MEMORY ELEMENT USING THE MAGNETORESISTIVE ELEMENT, AND RECORDING/REPRODUCTION METHOD FOR THE MEMORY ELEMENT

(75) Inventors: Naoki Nishimura, Tokyo (JP); Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/098,116

(22) Filed: Mar. 15, 2002

(65) Prior Publication Data

US 2002/0167059 A1 Nov. 14, 2002

(30) Foreign Application Priority Data

Mar. 19, 2001 (JP) .......................... 2001-078470
Mar. 19, 2001 (JP) .......................... 2001-078472
Dec. 4, 2001 (JP) .......................... 2001-369769

(51) Int. Cl.$^7$ .......................... H01L 29/82; H01L 43/00
(52) U.S. Cl. .......................... 257/421; 257/295
(58) Field of Search .......................... 257/421, 295

(56) References Cited

U.S. PATENT DOCUMENTS 5,173,873 A 12/1992 Wu et al. .................... 365/173
6,172,904 B1 1/2001 Anthony et al. ............ 365/173

FOREIGN PATENT DOCUMENTS

EP 933 782 8/1999
TW 498 327 8/2002

*Primary Examiner*—David Nelms
*Assistant Examiner*—Tu-Tu Ho
(74) *Attorney, Agent, or Firm*—Fitzpatrick, Cella, Harper & Scinto

(57) ABSTRACT

A magnetoresistive element includes first, second, and third magnetic layers and a nonmagnetic layer. The first magnetic layer is magnetized perpendicularly to the film surface. The second magnetic layer is magnetized perpendicularly to the film surface and has a coercive force higher than that of the first magnetic layer. The nonmagnetic layer is inserted between the first and second magnetic layers. The third magnetic layer has a coercive force higher than that of the first magnetic layer and is magnetized antiparallel to the second magnetic layer. A memory element and recording/reproduction method are also disclosed.

13 Claims, 23 Drawing Sheets

FIG. 19A
FIG. 19B
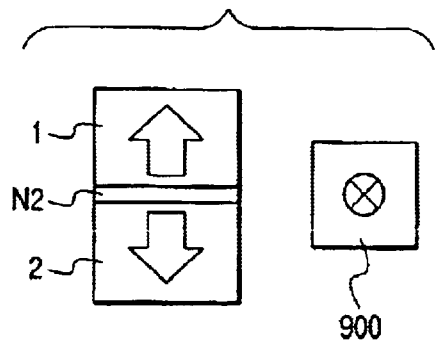
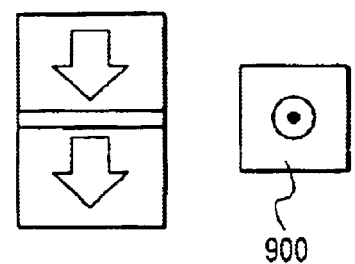
FIG. 20A
FIG. 20B
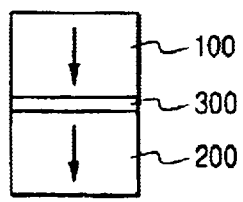
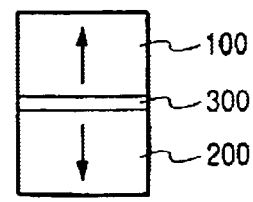
PRIOR ART
PRIOR ART

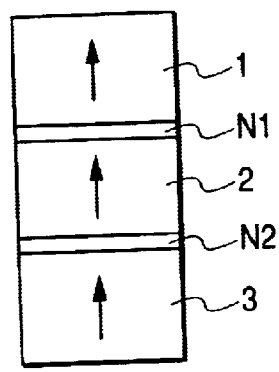
FIG. 39A1
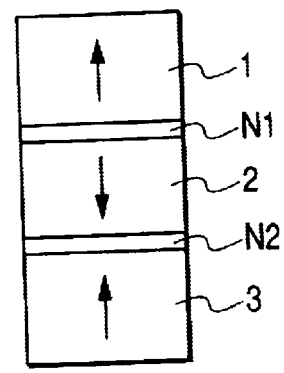
FIG. 39A2
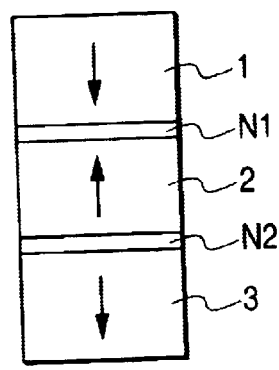
FIG. 39B1
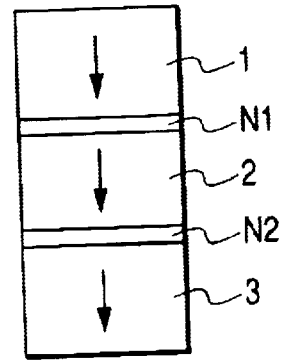
FIG. 39B2

FIG. 40A1
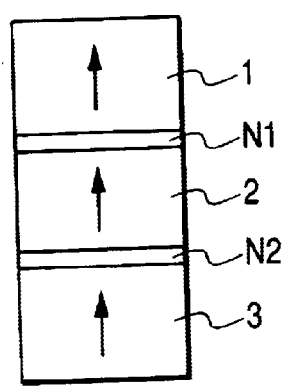
FIG. 40A2
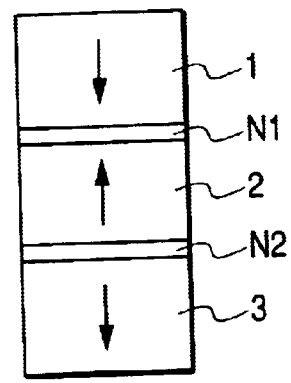
FIG. 40B1
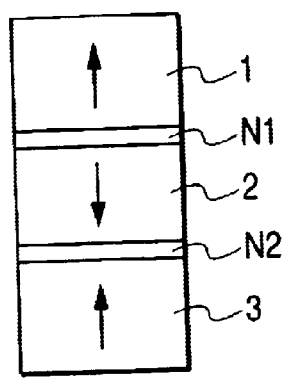
FIG. 40B2
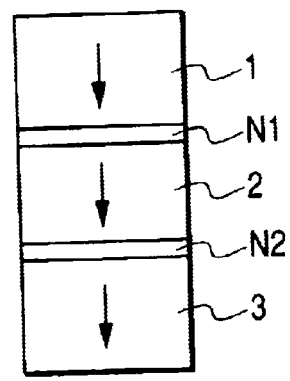

MAGNETORESISTIVE ELEMENT, MEMORY ELEMENT USING THE MAGNETORESISTIVE ELEMENT, AND RECORDING/REPRODUCTION METHOD FOR THE MEMORY ELEMENT

BACKGROUND OF THE INVENTION

1. Field of the Invention

The present invention relates to a magnetoresistive element applied to a nonvolatile memory or the like.

2. Related Background Art

Recently, magnetic memory elements for storing information by using a magneto-resistance effect receive attention as high-density, high-response, nonvolatile solid-state storage elements. It has been examined to constitute a RAM (Random Access Memory) by using the magnetic memory element. The magnetic memory element can store information by the magnetization direction of a magnetic layer, and can constitute a nonvolatile memory for semipermanently holding information. Magnetic memory elements are expected to be used as various recording elements such as information storage elements for a portable terminal and card. Especially a magnetic memory element using a spin tunneling magnetoresistance (TMR) effect can utilize a high-output characteristic obtained by the TMR effect. This magnetic memory element also allows high-speed read, and its practical use is expected.

In the magnetic memory element, the minimum unit for storing information is called a magnetic memory cell. The magnetic memory cell generally has a memory layer and reference layer. The reference layer is a magnetic material layer whose magnetization direction is fixed or pinned in a specific direction. The memory layer is a layer for storing information, and is generally a magnetic material layer capable of changing its magnetization direction by externally applying a magnetic field. The logic state of the magnetic memory cell is determined by whether the magnetization direction in the memory layer is parallel to that in the reference layer. If these magnetization directions are parallel to each other because of the MR (MagnetoResistance) effect, the resistance of the magnetic memory cell decreases; if these directions are not parallel, the resistance of the magnetic memory cell increases. The logic state of the magnetic memory cell is determined by measuring its resistivity.

Information is written in the magnetic memory cell by changing the magnetization direction within the memory layer by a magnetic field generated by flowing a current through a conductor. Written information is read out using an absolute detection method of detecting the absolute value of a resistance.

Another memory cell has a memory layer and detection layer. This memory cell employs a differential detection method for read because the magnetization direction of the detection layer is changed and the magnetization direction of the memory layer is detected from a change in resistance.

The magnetic memory cell must shrink in feature size for high integration degrees. Generally in a longitudinal magnetization layer, the spin curls at the film edge due to a demagnetizing field within the film surface along with the miniaturization. The magnetic memory cell cannot stably store magnetic information. To prevent this problem, the present inventor has disclosed in U.S. Pat. No. 6,219,725 an MR element using a magnetic film (perpendicular magnetization film) magnetized perpendicularly to the film surface. The perpendicular magnetization film is free from any curling even upon miniaturization, and is suitable for miniaturization.

A magnetic memory cell using an MR element includes two magnetic layers stacked via a thin nonmagnetic layer (tunnel insulating layer). A magnetic field leaked from one magnetic layer within the magnetic memory cell influences the other magnetic layer. The magnetic field is kept applied even in the absence of an external magnetic field.

FIGS. 20A and 20B show examples of the magnetization direction of a TMR element having a perpendicular magnetization film. A magnetic film 100 having a low coercive force and a magnetic film 200 having a higher coercive force are stacked via a tunnel insulating film 300. In both the examples shown in FIGS. 20A and 20B, the magnetic film 200 is magnetized downward. The magnetic film 100 is magnetized downward in FIG. 20A, and upward in FIG. 20B. Hence, the resistance value of the magnetic memory cell is larger in FIG. 20B than in FIG. 20A.

This state may be considered as a structure using the absolute value detection method in which the magnetic layer 200 is a reference layer (pinned layer), the magnetic layer 10 is a memory layer, "0" is recorded as shown in FIG. 20A, and "1" is recorded as shown in FIG. 20B. Alternatively, this state may be considered as a structure using the differential detection method in which the magnetic layer 200 is a memory layer, the magnetic layer 10 is a detection layer, and the magnetization is switched from the state shown in FIG. 20A to the state shown in FIG. 20B by an external magnetic field in detection.

FIG. 21A shows the MH curve of this element (graph showing the relationship between the magnetization and the application magnetic field) on the assumption that no magnetic field is leaked from the other magnetic film with a squareness ratio of 1. A magnetic field small enough to keep the magnetization direction unchanged is applied to the magnetic layer 200. Therefore, a curve corresponding to the magnetization direction of the magnetic layer 100 appears. In the absence of a magnetic field leaked from the other magnetic film, i.e., an offset magnetic field, information can be recorded on the memory layer only by applying a magnetic field H1 or H2 equal to a coercive force Hc. Alternatively, the magnetization of the detection layer can be switched. The magnetic field H1 switches the first magnetic film from the upward direction to the downward direction. The magnetic field H2 switches the first magnetic film from the downward direction to the upward direction.

In practice, the other magnetic layer, in this case, the magnetic film 200 applies a downward magnetic field to the magnetic film 100. The MR curve shifts by the offset magnetic field Ho, as shown in FIG. 21B. In this case, the recording magnetic field is H2=Hc+Ho and H1=Hc−Ho. The magnetic field necessary to change the state of FIG. 21B to that of FIG. 21A decreases by Ho. To the contrary, the magnetic field necessary to change the state of FIG. 21A to that of FIG. 21B increases by Ho. This means that a current value flowing through a write line increases. Current consumption may increase, or when the current exceeds the allowable current density of write line wiring, write may fail. In this case, the magnitude of a switching magnetic field changes depending on information recorded on a memory cell. If memory cell information which requires the switching magnetic field H2 is rewritten in recording information in memory cells arrayed in a matrix via two perpendicular write lines, adjacent memory cell information which requires the switching magnetic field H1 is also rewritten. Such erroneous recording operation may occur at a high possibility. If the offset magnetic field Ho becomes larger than the coercive force Hc, as shown in FIG. 21C, only one resistance value can be taken in zero magnetic field. This makes absolute detection difficult.

When the squareness ratio is not 1, a magnetization M in zero magnetic field becomes smaller than a maximum magnetization value Mmax of an antiparallel magnetization state. The resistance value also changes depending on the magnetization magnitude of the low-coercive-force layer. In this case, a readout resistance value difference R2–R1 decreases, degrading the detection sensitivity. This phenomenon occurs even in an offset magnetic field Ho smaller than the coercive force Hc. Note that R1 represents the minimum resistance value in the absence of an external magnetic field; and R2, the maximum resistance value in the absence of an external magnetic field. FIG. 22A shows the resistance value in the presence of the offset magnetic field Ho, and FIG. 22B shows the resistance value in the absence of the offset magnetic field Ho.

For a squareness ratio of not 1, even application of a magnetic field equal in magnitude to the coercive force does not completely saturate the magnetization, as shown in FIG. 22B. A magnetic field which completely saturates magnetization, M Ms, will be called a magnetization saturation magnetic field Hs. When the memory layer completely saturates to be antiparallel to the pinned layer, the resistance value maximizes to a constant value with respect to the magnetic field. That is, the magnetic field which saturates in the resistance value is equal to Hs, as shown in FIG. 22B. For a squareness ratio of 1, the coercive force can be regarded equal to a magnetization switching magnetic field. For a squareness ratio of not 1, the coercive force cannot be regarded equal to this magnetic field. In this case, the magnetization must be switched by applying a magnetic field larger than that having a squareness ratio of 1. In the presence of an offset magnetic field generated by a leaked magnetic field, the difference in the magnitude of a magnetic field applied to switch the magnetization becomes larger between a direction in which the magnetization is easy to switch and a direction in which the magnetization is difficult to switch. If such an element is employed as the memory element of an MRAM, the above-described erroneous operation may occur at a higher possibility. Malfunction may occur when a magnetization switching magnetic field is not controlled in the use of a magnetoresistive element as the memory element of an MRAM.

The above description mainly assumes the absolute value detection method, but similarly applies to the differential detection method. FIG. 23 shows the major loop of the differential detection method.

The above-described problems in the MR element are serious particularly in a magnetoresistive element using a longitudinal magnetization film adopted in a conventional MRAM.

SUMMARY OF THE INVENTION

It is an object of the present invention to solve the problem that a static magnetic field from one magnetic layer offsets the switching magnetic field of the other magnetic layer in a magnetoresistive element used as a memory element or the like and the problem that the switching magnetic field increases, and to provide a memory element using this magnetoresistive element and its recording/reproduction method.

To achieve the above object, the present invention provides a magnetoresistive element comprising
  a first magnetic layer magnetized perpendicularly to a film plane,
  a second magnetic layer which is magnetized perpendicularly to the film surface and has a coercive force higher than a coercive force of the first magnetic layer,
  a nonmagnetic layer inserted between the first and second magnetic layers, and
  a third magnetic layer which has a coercive force higher than the coercive force of the first magnetic layer and is magnetized antiparallel to the second magnetic layer.

BRIEF DESCRIPTION OF THE DRAWINGS

FIGS. 19A and 19B are sectional views showing the basic structure of a memory cell according to the eighth embodiment;

FIGS. 20A and 20B are sectional views showing the structure of the conventional magnetoresistive element;

FIGS. 39A1, 39A2, 39B1 and 39B2 are sectional views for explaining read of information from a memory element according to the fourteenth embodiment;

FIGS. 40A1, 40A2, 40B1 and 40B2 are sectional views for explaining another example of read of information from the memory element according to the fourteenth embodiment;

DETAILED DESCRIPTION OF THE PREFERRED EMBODIMENTS

Preferred embodiments of the present invention will be described below with reference to the accompanying drawings.

(First Embodiment)

Figure 1A:
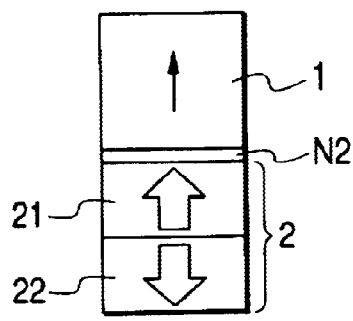
FIGS. 1A and 1B are sectional views showing an example of a magnetoresistive element according to the first embodiment.
Figure 1B:
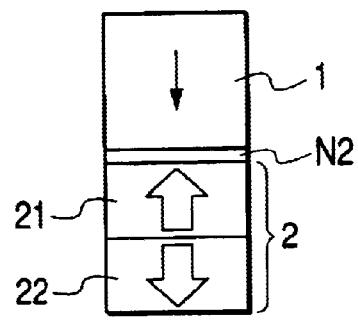

FIGS. 1A and 1B are sectional views showing the film structure of a magnetoresistive element according to the first embodiment of the present invention. In FIGS. 1A and 1B, arrows indicate magnetization directions in magnetic layers. FIGS. 1A and 1B show two prospective magnetization states of the magnetoresistive element. If data is read out from the magnetoresistive element by the absolute detection method, the states shown in FIGS. 1A and 1B correspond to binary recording levels "0" and "1".

A magnetic layer 1 magnetized perpendicularly to the film surface, a nonmagnetic insulating layer N2, and a magnetic layer 2 magnetized perpendicularly to the film surface are stacked in an order named. The insulating layer N2 is thick enough to flow a tunneling current between the magnetic layers 1 and 2 via the insulating layer N2. The coercive force of the entire magnetic layer 2 is higher than that of the magnetic layer 1. In the magnetoresistive element, a resistance value upon flowing a current flows between the first and second magnetic layers 1 and 2 via the insulating layer N2 changes depending on the relative magnetization angles of the magnetic layers 1 and 2. By detecting this resistance value, information written in the magnetoresistive element can be determined. More specifically, the magnetic layer 1, insulating layer N2, and magnetic layer 2 form a ferromagnetic tunnel junction. Conduction electrons in the magnetic layers 1 and 2 tunnel through the insulating layer N2 while maintaining their spin. The tunnel probability changes depending on the magnetization states of the two magnetic layers 1 and 2. This is detected as a change in tunnel resistance. The resistance value is small when the magnetization states of the magnetic layers 1 and 2 are parallel to each other, and large when they are antiparallel to each other.

In the magnetoresistive element, the magnetic layer 2 is formed by stacking magnetic layers 21 and 22 serving as perpendicular magnetization films magnetized antiparallel to each other. The magnetic layer 21 is formed on the magnetic layer 1 side (so as to contact the insulating layer N2). In the example shown in FIGS. 1A and 1B, the magnetization of the magnetic layer 21 orients upward, and that of the magnetic layer 22 orients downward. The magnetic layer 1 receives an upward magnetic field by the magnetization of the magnetic layer 21 and a downward magnetic field by the magnetization of the magnetic layer 22. An apparent magnetic field applied to the magnetic layer 1 is a combination of these magnetic fields. A leaked magnetic field applied to the magnetic layer 1 can be decreased in comparison with a case wherein the magnetic layer 2 is formed from only one magnetic layer. An offset of the switching magnetic field of the magnetic layer 1 can therefore be suppressed. When the magnetoresistive element is applied to a magnetic memory cell, the write current can be reduced, and erroneous write to an adjacent memory cell can be prevented.

Figure 2A:
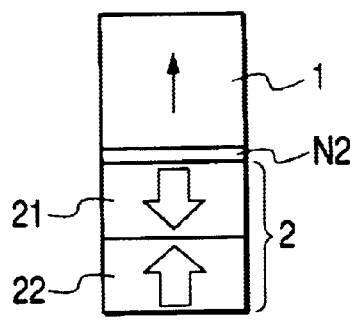
FIGS. 2A and 2B are sectional views showing another example of the magnetoresistive element according to the first embodiment.
Figure 2B:
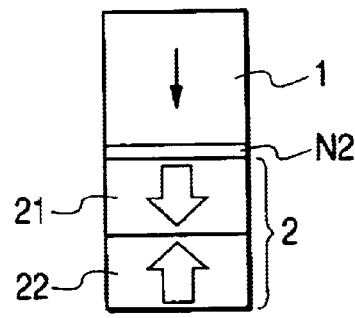

As shown in FIGS. 2A and 2B, the magnetization directions of the magnetic layers 21 and 22 may be switched such that the magnetic layer 21 is magnetized downward and the magnetic layer 22 is magnetized upward. This magnetoresistive element may be constituted as a GMR element sandwiched between the magnetic layers by replacing the nonmagnetic layer sandwiched between with a conductor. However, the effects of the magnetoresistive element are more significant for a TMR element using a thinner nonmagnetic layer.

(Second Embodiment)

Figure 3A:
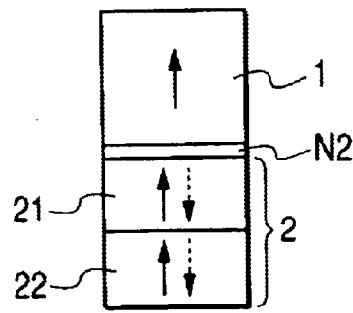
FIGS. 3A and 3B are sectional views showing an example of a magnetoresistive element according to the second embodiment.
Figure 3B:
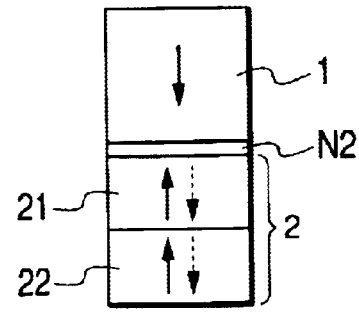

FIGS. 3A and 3B are sectional views showing a film structure of a magnetoresistive element according to the second embodiment. In this magnetoresistive element, the magnetic layer 2 in the first embodiment, i.e., the magnetic layers 21 and 22 which constitute a high-coercive-force layer are made of a ferrimagnetic film of a rare earth-iron family element alloy. The sublattice magnetization of the iron family element is dominant in the magnetic layer 21, whereas the sublattice magnetization of the rare earth element is dominant in the magnetic layer 21. A magnetic layer 1 and insulating layer N2 are identical to those in the first embodiment. FIGS. 3A and 3B show two prospective magnetization states of the magnetoresistive element. Each solid line in the magnetic layers 21 and 22 represents the sublattice magnetization direction of the iron family element; and each dotted line, the sublattice magnetization direction of the rare earth element. The length of each line represents the magnitude of the sublattice magnetization.

The magnetic layers 21 and 22 are exchange coupled. In the rare earth-iron family alloy, the iron family element is dominant over the exchange coupling force, and the iron family element orients in one direction. Rare earth elements magnetized antiparallel to the iron family elements also orient in the same direction in the magnetic layers 21 and 22. The magnetization of the entire ferrimagnetic film is the difference between sublattice magnetizations. As the magnetization directions of the magnetic layers 21 and 22 shown in FIGS. 3A and 3B, the net magnetization directions of the magnetic layers 21 and 22 are opposite to each other. For this reason, the magnetization of the whole magnetic layer 2 is smaller than the magnetization of each of the magnetic layers 21 and 22. The ferrimagnetic layer is originally smaller in magnetization magnitude than a longitudinal magnetization film which is made of Fe, Co, FeCo, or NiFe and is oriented within the film surface. The magnitude of a magnetic field applied from the magnetic layer 2 to the magnetic layer 1 is much smaller than that in an element having longitudinal magnetic anisotropy. This will be explained in detail in the fourteenth embodiment (to be described later).

In the second embodiment, the magnetic layer 2 is comprised of two layers whose saturation magnetization Ms is relatively large, and even a switching magnetic field can be reduced. When this element is adopted as a magnetic memory cell, the memory cell can be constituted for absolute detection and can also be constituted for differential detection in which the magnetic layer 2 is used as a memory layer and the magnetization is changed in accordance with information.

Figure 4:
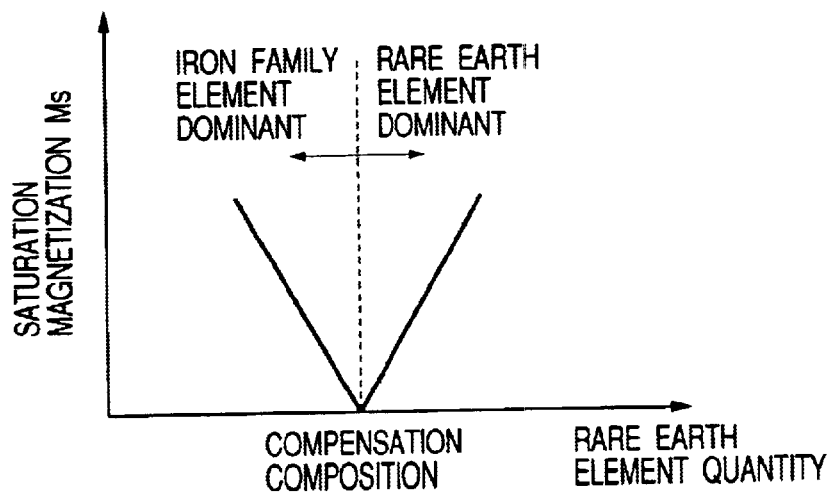
FIG. 4 is a graph showing the relationship between the composition and the saturation magnetization in a rare earth-iron family alloy.

FIG. 4 shows the relationship between the composition and the saturation magnetization in the rare earth-iron family alloy. In the rare earth-iron family alloy, the magnetization direction of the rare earth atom can be made antiparallel to that of the iron family atom. The sublattice magnetization of the rare earth element or iron family element becomes dominant at the boundary of the composition (to be referred to as a compensation composition) of the rare earth element and iron family element in the combined magnetic moment of these atoms. The saturation magnetization Ms apparently becomes 0 in the compensation composition, and increases as being apart from the compensation composition. A leaked magnetic field can be further reduced by designing both the magnetic layers 21 and 22 around the compensation composition.

A preferable example of the ferrimagnetic layer is a magnetic film made of an alloy of a rare earth element and iron family element. More specifically, the ferrimagnetic layer is desirably made of a rare earth element containing at least one of Gd, Tb, and Dy and an iron family element containing at least one of Fe and Co. These rare earth-iron family alloy can easily provide a perpendicular magnetization film at room temperature by a general-purpose film formation apparatus such as a sputtering apparatus. In particular, a semiconductor manufacturing process of manufacturing an MRAM suffers a high-temperature process to result in adverse influence such as degradation in MOS transistor performance. It is therefore effective that a perpendicular magnetization film can be formed at room temperature.

(Third Embodiment)

Figure 5A:
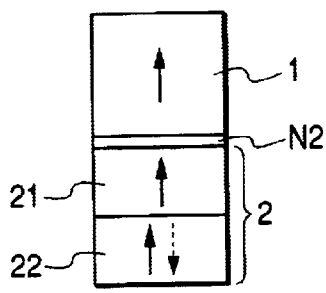
FIGS. 5A and 5B are sectional views showing an example of a magnetoresistive element according to the third embodiment.
Figure 5B:
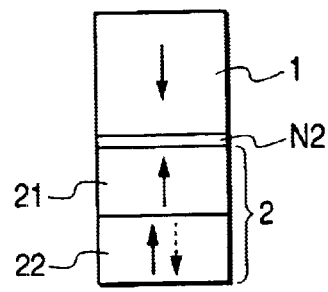

In a magnetoresistive element according to the third embodiment, a magnetic layer 21 very close to a nonmagnetic layer is made of a ferromagnetic layer containing an iron family element as a main component. A magnetic layer 22 is made of a ferrimagnetic layer of a rare earth-iron family element alloy in which the sublattice magnetization of the rare earth element is dominant. A magnetic layer 1 and insulating layer N2 are identical to those in the first embodiment. FIGS. 5A and 5B show two prospective magnetization states of the magnetoresistive element. Each solid line in the magnetic layers 21 and 22 represents the sublattice magnetization direction of the iron family element; and each dotted line, the sublattice magnetization direction of the rare earth element. The length of each line represents the magnitude of the sublattice magnetization.

The magnetoresistive element in the third embodiment is characterized in that a magnetic layer 2 is formed from a two-layered film made up of the iron family element film (magnetic layer 21) and the rare earth element (magnetic layer 22). In this case, the MR (magnetoresistance) ratio can be increased by forming a magnetic film having a high polarizability at the interface between the magnetic layer 2 and the insulating layer N2 serving as a tunnel barrier film. The magnetic layer 2 greatly concerns the magnetoresistance ratio because of the magnetization of the iron family element. The magnetic layer 21 is preferably so formed as to contact the tunnel barrier film. Examples of a thin iron family element film applicable to the magnetic layer 21 are Fe, Co, and FeCo thin films. Of these materials, FeCo is the most preferable because it exhibits a high polarizability and can increase the MR ratio. Note that an iron family element generally orients in the longitudinal direction on a single-layered film. The magnetic layer 2 is magnetized perpendicularly to the film surface by, e.g., the exchange coupling force from the magnetic layer 22.

Figure 6A:
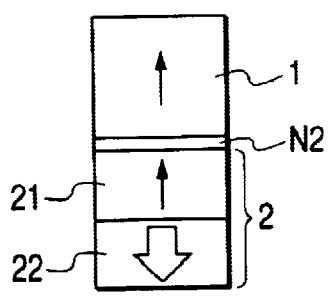
FIGS. 6A and 6B are sectional views showing the magnetization orientation state of the magnetoresistive element shown in FIGS. 5A and 5B.
Figure 6B:
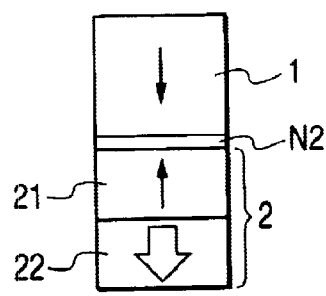

FIGS. 6A and 6B show magnetization orientation states. For descriptive convenience, the magnetization of the magnetic layer 22 is the combined magnetization of the sublattice magnetizations of the rare earth element and iron family element. The magnetic layer 2 is made of an antiparallel-magnetized two-layered film, which can reduce a magnetic field leaked to the magnetic layer 1.

Also in the third embodiment, the magnetic layer 2 can be formed from two layers having a relatively large saturation magnetization Ms. When the magnetic layer 2 is formed from a single-layered film having a small magnetization in order to reduce a magnetic field leaked to the magnetic layer 1, the coercive force tends to increase. By forming the magnetic layer 2 from a two-layered film having a large magnetization, a magnetic field leaked to the magnetic layer 1 can be reduced without increasing the coercive force. Reduction in switching magnetic field can also be achieved at the same time as reduction in offset magnetic force.

(Fourth Embodiment)

Figure 7A:
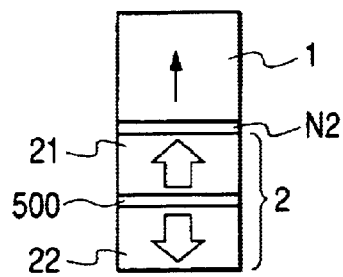
FIGS. 7A and 7B are sectional views showing an example of a magnetoresistive element according to the fourth embodiment.
Figure 7B:
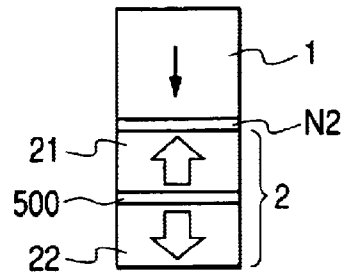

FIGS. 7A and 7B are sectional views showing the film structure of a magnetoresistive element according to the fifth embodiment. In this magnetoresistive element, an insulating film 500 is formed between magnetic layers 21 and 22. The use of the insulating film 500 easily realizes an antiparallel magnetization state while suppressing a magnetostatic junction between the magnetic layers 21 and 22.

To change the magnetic layers 21 and 22 to antiparallel magnetization states in this structure, films having different coercive forces are used. When the magnetic layer 21 has a coercive force higher than that of the magnetic layer 22, an external magnetic field is applied to switch the magnetization of the magnetic layer 21. Then, an external magnetic field in an opposite direction that is smaller than the coercive force of the magnetic layer 21 and higher than that of the magnetic layer 22 is applied to magnetize the magnetic layer 22 in a direction opposite to the magnetic layer 21.

The coercive force can be set to a desired value by changing the composition, for example, when a ferrimagnetic film such as a rare earth-iron family alloy is used, changing the composition of elements generating respective sublattice magnetizations.

(Fifth Embodiment)

Figure 8A:
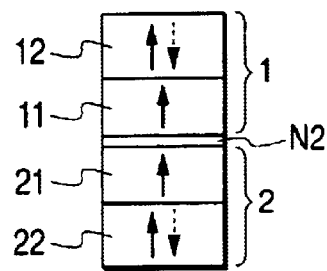
FIGS. 8A and 8B are sectional views showing an example of a magnetoresistive element according to the fifth embodiment.
Figure 8B:
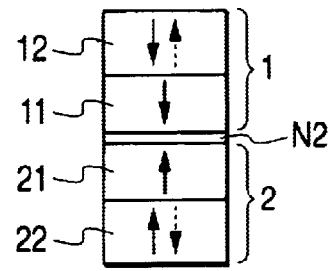

In the sixth embodiment, a low-coercive-force layer is made up of two layers, similar to a high-coercive-layer. FIGS. 8A and 8B are sectional views showing the film structure of this magnetoresistive element. In the magnetoresistive element, a magnetic layer 1, i.e., low-coercive-force layer is made up of magnetic layers 11 and 12 serving as perpendicular magnetization films magnetized parallel to each other. In the sixth embodiment, the magnetic layer 11 is formed on a magnetic layer 2 side (so as to contact an insulating layer N2). This is because the MR (magnetoresistance) ratio can be increased by forming a magnetic film having a high spin polarizability at the interface between the magnetic layer 1 and the insulating layer N2 serving as a tunnel barrier film. Examples of such a magnetic layer are Fe, Co, and FeCo thin films. Of these materials, FeCo is the most preferable because it exhibits a high polarizability and can increase the MR ratio. Note that an iron family element generally orients in the longitudinal direction within a single-layered film. The magnetic layer 1 is magnetized perpendicularly to the film surface by the exchange coupling force from the magnetic layer 12. In the following description, "a layer having a high spin polarizability" means a layer whose spin polarizability is higher than that of a magnetic layer in contact with this layer.

Figure 9A:
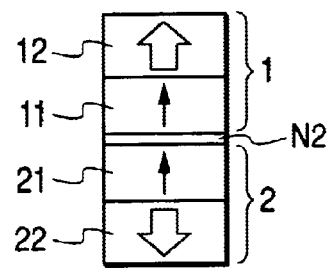
FIGS. 9A and 9B are sectional views showing the magnetizations of entire magnetic layers 11 and 12 in the magnetoresistive element shown in FIGS. 8A and 8B.
Figure 9B:
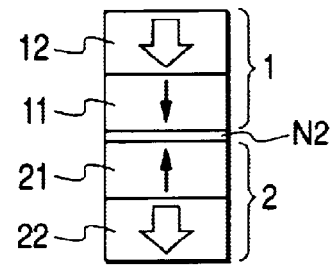

As shown in FIGS. 8A and 8B, the magnetic layer 11 can be made of a ferromagnetic layer containing an iron family element, and the magnetic layer 2 can be made of a ferrimagnetic film of a rare earth-iron family element alloy in which the sublattice magnetization of the iron family element is dominant. FIGS. 9A and 9B show the overall magnetization of the magnetic layers 11 and 12 in this case. As described above, the magnetic layer 2 is comprised of an antiparallel-magnetized two-layered film (magnetic layers 21 and 22). A magnetic field which is generated by the magnetization of the magnetic layer 2 and leaked to the magnetic layer 1 is small, but a magnetic field which is generated by the magnetization of the magnetic layer 1 and leaked to the magnetic layer 2 is large.

This structure is suitable for a structure using the magnetic layer 2 as a pinned layer (reference layer) and the magnetic layer 1 as a memory layer. This is because the pinned layer can be set to a large coercive force without switching its magnetization and is hardly influenced by a magnetic field leaked from the magnetic layer 1. To the contrary, the magnetic layer 1 serving as a memory layer must be decreased in coercive force (magnetization switching magnetic field) so as to minimize the current consumption of a write line, thereby reducing an offset magnetic field generated by a magnetic field leaked from the magnetic layer 2. This is achievable by forming the magnetic layer 2 from an antiparallel-magnetized two-layered film.

Figure 10A:
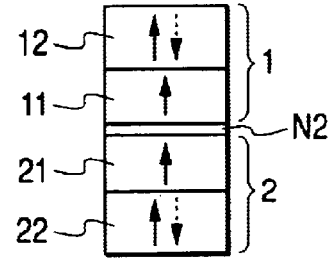
FIGS. 10A and 10B are sectional views showing another example of the magnetoresistive element according to the fifth embodiment.
Figure 10B:
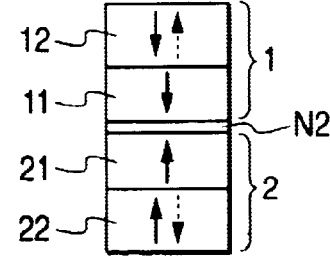
Figure 11A:
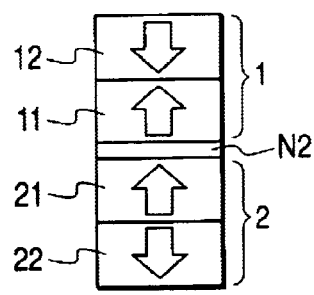
FIGS. 11A and 11B are sectional views showing the magnetizations of the entire magnetic layers 11 and 12 in the magnetoresistive element shown in FIGS. 10A and 10B.
Figure 11B:
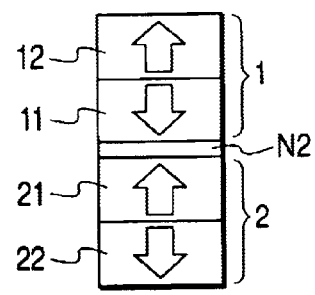

In the above example, the magnetic layer 12 is made of a ferrimagnetic film of a rare earth-iron family element alloy in which the sublattice magnetization of the iron family element is dominant. The magnetic layer 12 can also be made of a ferrimagnetic film of a rare earth-iron family element alloy in which the sublattice magnetization of the rare earth element is dominant. FIGS. 10A and 10B are sectional views showing the film structure of such a magnetoresistive element. FIGS. 11A and 11B are sectional views showing the overall magnetization of the magnetic layers 11 and 12 in the magnetoresistive element shown in FIGS. 10A and 10B.

(Sixth Embodiment)

Figure 24A:
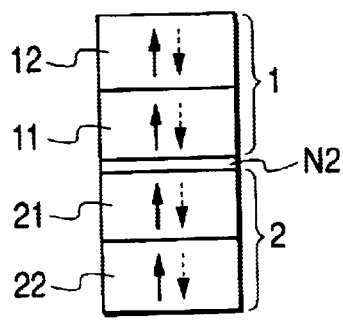
FIGS. 24A and 24B are sectional views showing another example of a magnetoresistive element according to the sixth embodiment of the present invention.
Figure 24B:
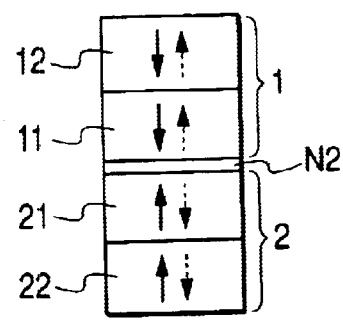
Figure 25A:
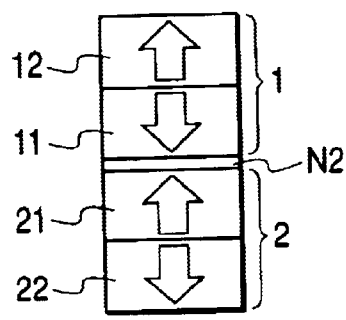
FIGS. 25A and 25B are sectional views showing the magnetizations of entire magnetic layers 11 and 12 in the magnetoresistive element shown in FIGS. 24A and 24B.
Figure 25B:
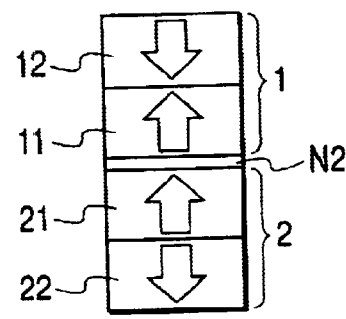

In the seventh embodiment, a magnetic layer 1 is made up of two antiparallel-magnetized layers, similar to a magnetic layer 2. As shown in FIGS. 24A and 24B, each of the two magnetic layers is made of a ferrimagnetic two-layered film. Each solid line represents the sublattice magnetization direction of an iron family element; and each dotted line, the sublattice magnetization direction of a rare earth element. The length of each line represents the magnitude of the sublattice magnetization. In FIGS. 24A and 24B, a magnetic layer 11 is made of an alloy film of a rare earth element and iron family element in which the sublattice magnetization of the rare earth element is dominant. A magnetic layer 12 is made of an identical alloy film in which the sublattice magnetization of the iron family element is dominant. A magnetic layer 22 is made of an identical alloy film in which the sublattice magnetization of the rare earth element is dominant. A magnetic layer 22 is made of an identical alloy film in which the sublattice magnetization of the rare earth element is dominant. In the seventh embodiment, the magnetic layer 11 is formed on the magnetic layer 2 side (so as to contact an insulating layer N2). FIGS. 25A and 25B show the whole magnetization of the magnetic layers 11 and 12 in this case.

In the seventh embodiment, the coercive forces of both the magnetic layers 1 and 2 can be so decreased as not to apply magnetic fields leaked from the magnetic layers 1 and 2 to each other. The magnetizations of these magnetic layers 1 and 2 can be switched, which enables differential detection in addition to absolute detection. This structure is suitable for a structure in which the magnetic layer 2 functions as a memory layer, the magnetic layer 1 functions as a detection layer, and information is read out by the differential detection method.

The magnetic layer 11 has a composition in which the sublattice magnetization of the rare earth element is dominant. The magnetic layer 12 has a composition in which the sublattice magnetization of the iron family element is dominant. The magnetic layers 11 and 12 may have opposite compositions. This also applies to the magnetic layers 21 and 22. Since the iron family element is mainly caused by the tunneling effect, the magnetic layers 21 and 11 which are closer to the tunnel barrier film preferably take a composition in which the sublattice magnetization of the iron family element is dominant.

(Seventh Embodiment)

The planar distribution of a magnetic field leaked from a magnetic layer in a magnetoresistive element according to the present invention will be explained in comparison with a conventional one.

Figure 12:
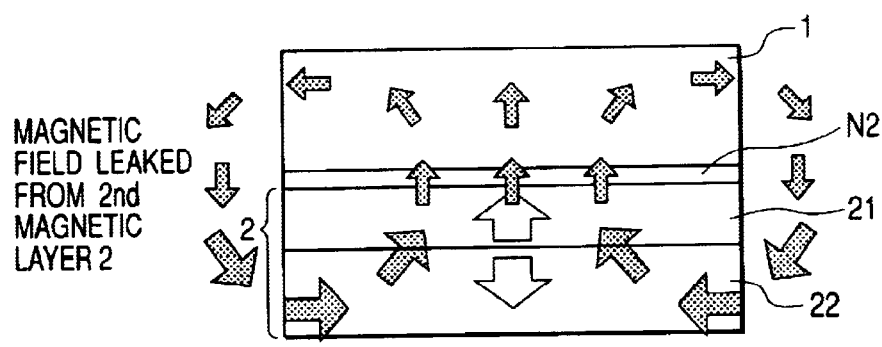
FIG. 12 is a view showing the application state of a leaked magnetic field in the magnetoresistive element according to the seventh embodiment of the present invention using a perpendicular magnetization film.

FIG. 12 shows the state of a magnetic field leaked from a magnetic layer 2 to a magnetic layer 1 in the magnetoresistive element according to the first embodiment. The magnetic layer 2 is made up of magnetic layers 21 and 22 magnetized antiparallel to each other. A magnetic field generated from the magnetic layer 2 is substantially canceled by the magnetic layers 21 and 22. For descriptive convenience, a magnetic field from the magnetic layer 21 magnetized upward is slightly larger than that from the magnetic layer 22 magnetized downward.

Figure 13:
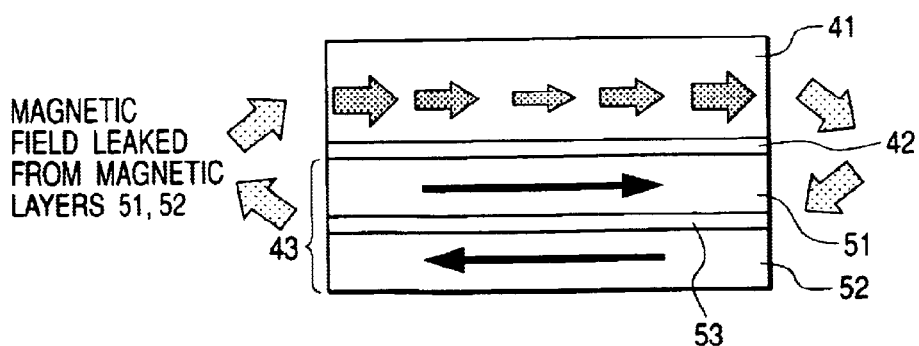
FIG. 13 is a view showing the application state of a leaked magnetic field in a conventional magnetoresistive element.

FIG. 13 shows the film structure of a magnetoresistive element using a conventional longitudinal magnetization film. Also in the conventional magnetoresistive element, an upper magnetic layer 41, insulating layer 42, and lower magnetic layer 43 are stacked in an order named. In this structure, the lower magnetic layer 43 is made up of magnetic layers 51 and 52 magnetized antiparallel to each other. These magnetic layers 51 and 52 must be designed to an antiparallel magnetization state by interposing an intermediate layer 53 made of Ru or the like between them. The film thickness of the Ru film serving as the intermediate layer 53 is about 0.7 nm. The allowable range of the film thickness is merely ±0.1 nm, which results in a narrow manufacturing margin and low yield. To the contrary, the magnetoresistive element of the present invention does not require such an intermediate layer. This is advantageous in simple fabrication process and manufacturing margin.

Figure 14:
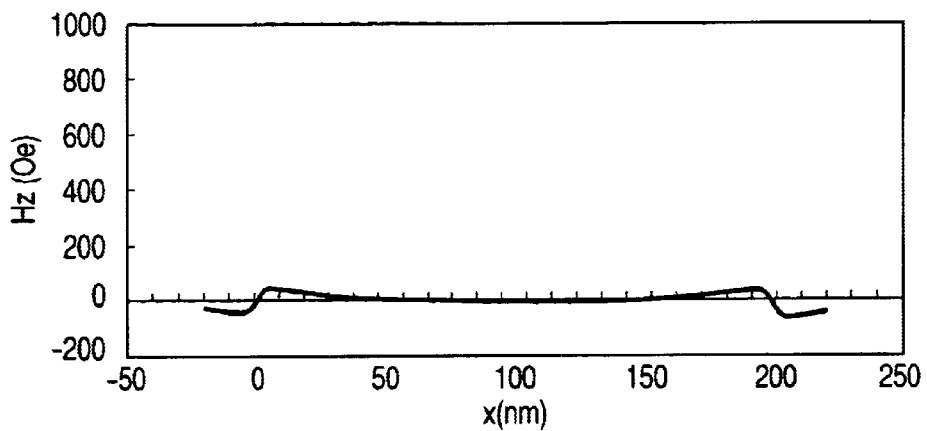
FIG. 14 is a graph showing the distribution of a leaked magnetic field in an embodiment of the magnetoresistive element according to the present invention.

FIG. 14 shows the leaked magnetic field of FIG. 12 as a function of the abscissa x as for the magnetoresistive element shown in FIG. 12. FIG. 14 shows a magnetic field perpendicular to the film surface at a point 1 nm above the magnetic layer 2 formed from a 0.2-$\mu$m$\square$ two-layered film of a 20-nm thick rare earth-iron family alloy in which the rare earth element is dominant (RE rich) and the magnetization is 20 emu/cc, and a 30-nm thick rare earth-iron family alloy in which the iron family element is dominant (TM rich) and the magnetization is 20 emu/cc. Only a magnetic field of 50 Oe ($3.98 \times 10^3$ A/m) is applied at most.

Figure 15:
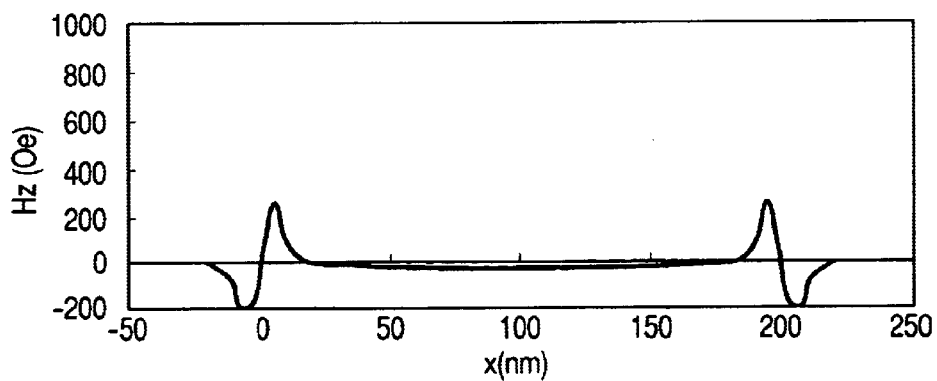
FIG. 15 is a graph showing the distribution of a leaked magnetic field in the embodiment of the magnetoresistive element according to the present invention.

As for the magnetoresistive element shown in FIG. 12, FIG. 15 shows a magnetic field perpendicular to the film surface at a point 1 nm above the magnetic layer 2 formed from a 0.2-$\mu$m$\square$ two-layered film of a 50-nm thick rare earth-iron family alloy in which RE is rich and the magnetization is 50 emu/cc, and a 1-nm thick Co film (magnetization magnitude: 1,000 emu/cc). Only a magnetic field of 250 Oe ($19.9 \times 10^3$ A/m) is applied at most.

Figure 16:
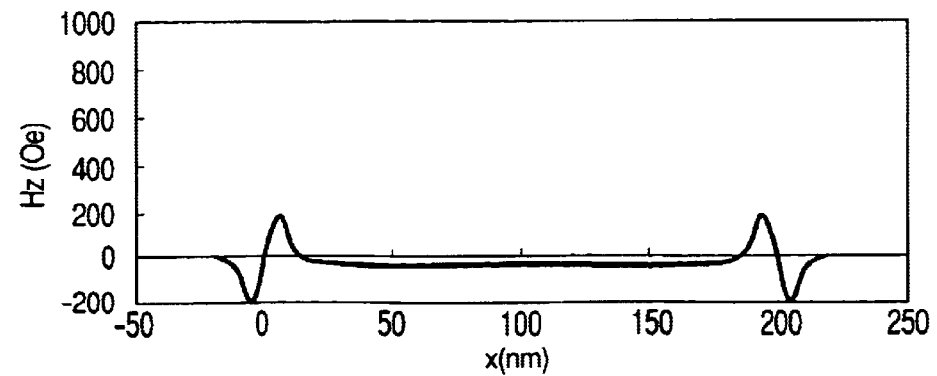
FIG. 16 is a graph showing the distribution of a leaked magnetic field in the embodiment of the magnetoresistive element according to the present invention.

As for the magnetoresistive element shown in FIG. 12, FIG. 16 shows a magnetic field perpendicular to the film surface at a point 1 nm above the magnetic layer 2 formed from a 0.2-$\mu$m$\square$ two-layered film of a 50-nm thick rare earth-iron family alloy in which RE is rich and the magnetization is 50 emu/cc, and a 1-nm thick Co film (magnetization magnitude: 800 emu/cc). Only a magnetic field of 170 Oe ($13.5 \times 10^3$ A/m) is applied at most.

Figure 17:
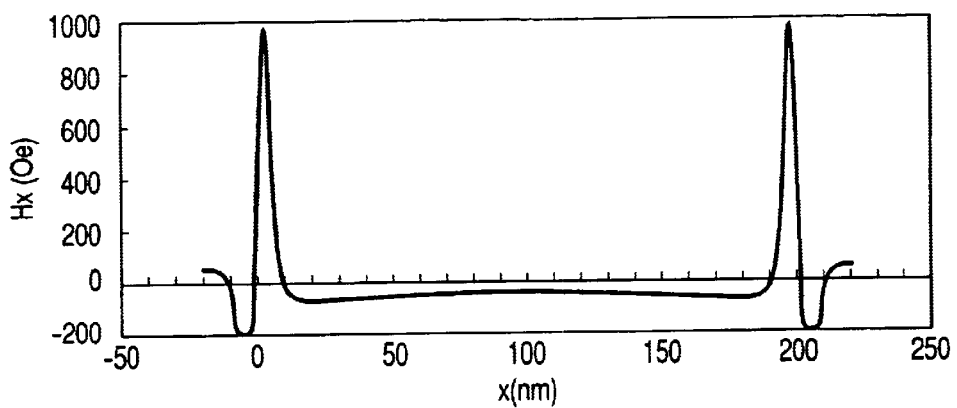
FIG. 17 is a graph showing the distribution of a leaked magnetic field in a conventional magnetoresistive element.

As a comparative example, FIG. 17 shows a leaked magnetic field in the transverse direction of the film surface 1 nm above a conventional element (see FIGS. 3A and 3B) formed from a longitudinal magnetization film of a 0.2-$\mu$m$\square$ stacked film made of Co (film thickness: 4 nm), Ru (film thickness: 0.7 nm), and Co (film thickness: 3 nm). The magnetization of Co is 1,000 emu/cc. A magnetic field of about 1,000 Oe ($79.6 \times 10^3$ A/m) is applied at the end face.

Figure 18:
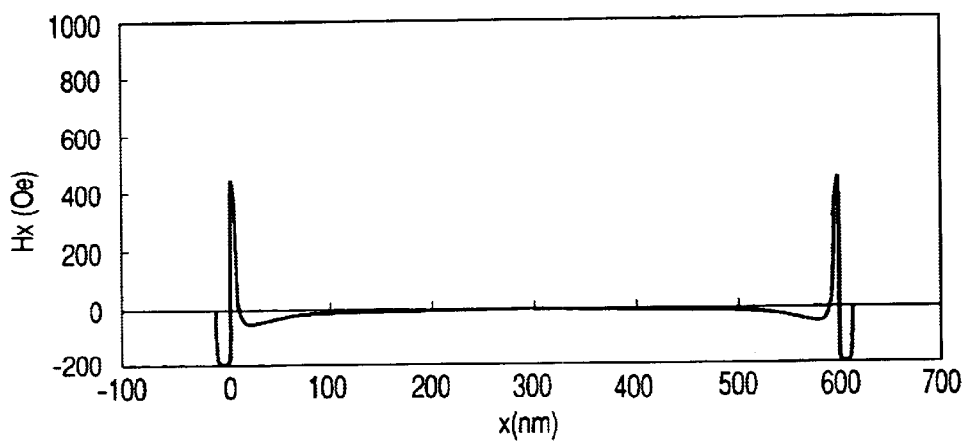
FIG. 18 is a graph showing the distribution of a leaked magnetic field in the conventional magnetoresistive element.
Figure 21A:
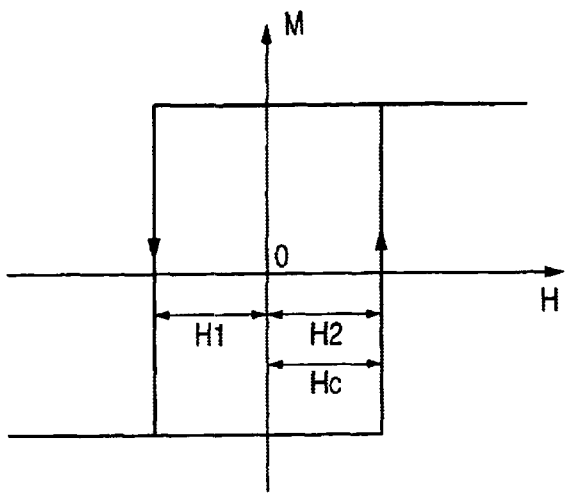
FIGS. 21A, 21B and 21C are graphs showing an offset magnetic field in an MH curve for a squareness of 1.
Figure 21B:
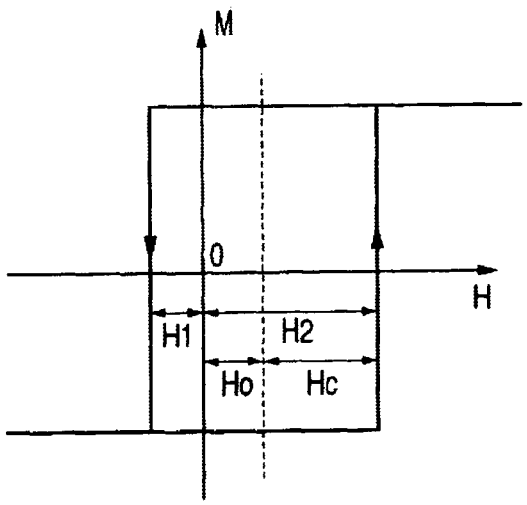
Figure 21C:
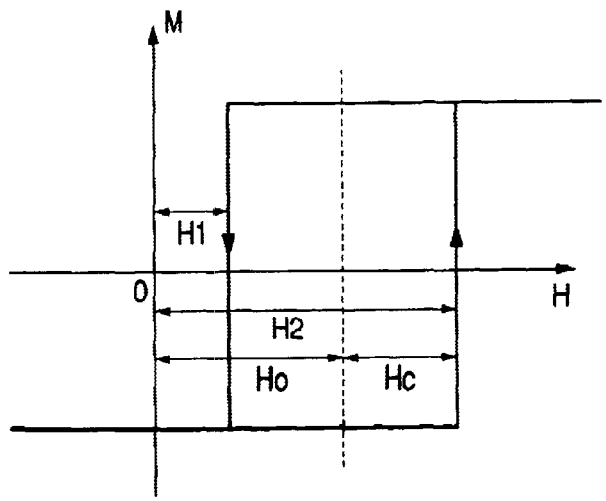
Figure 22A:
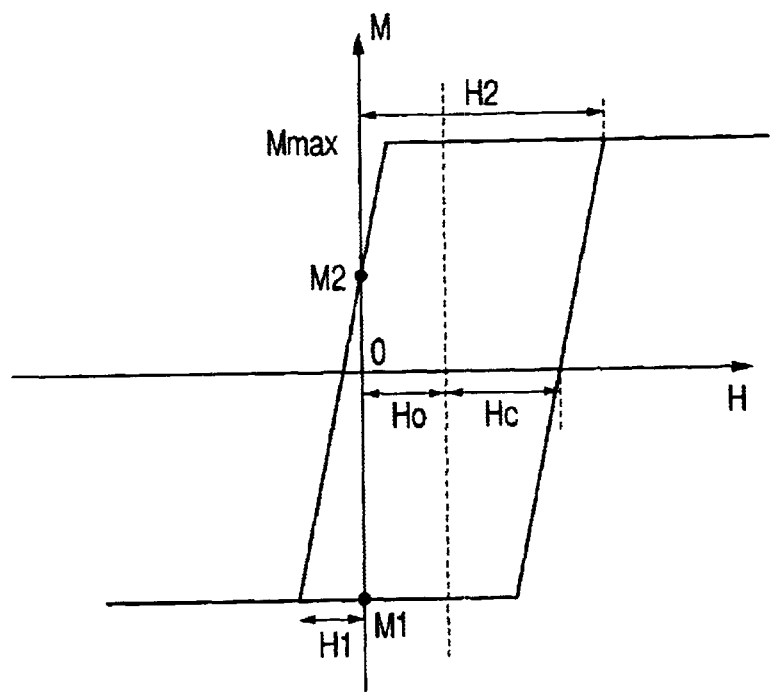
FIGS. 22A and 22B are graphs showing an offset magnetic field in a MH curve for a squareness of not 1.
Figure 22B:
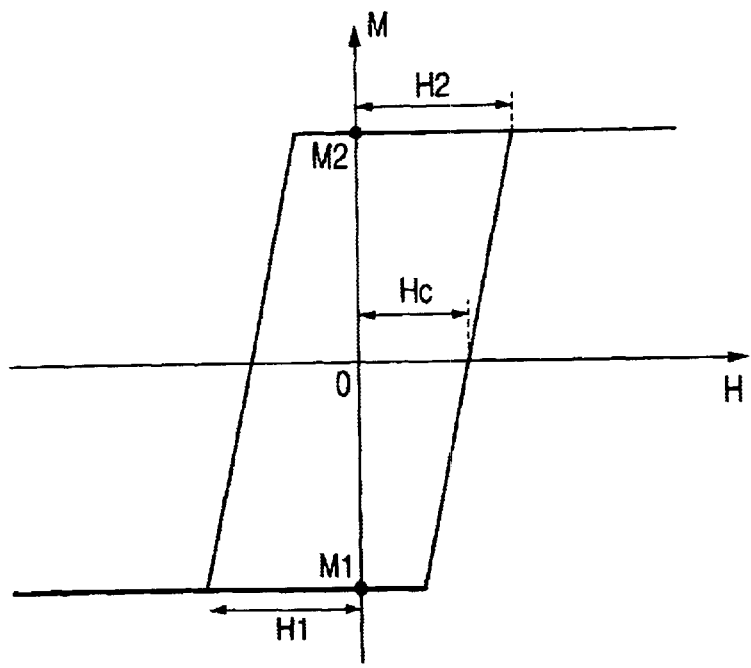
Figure 23:
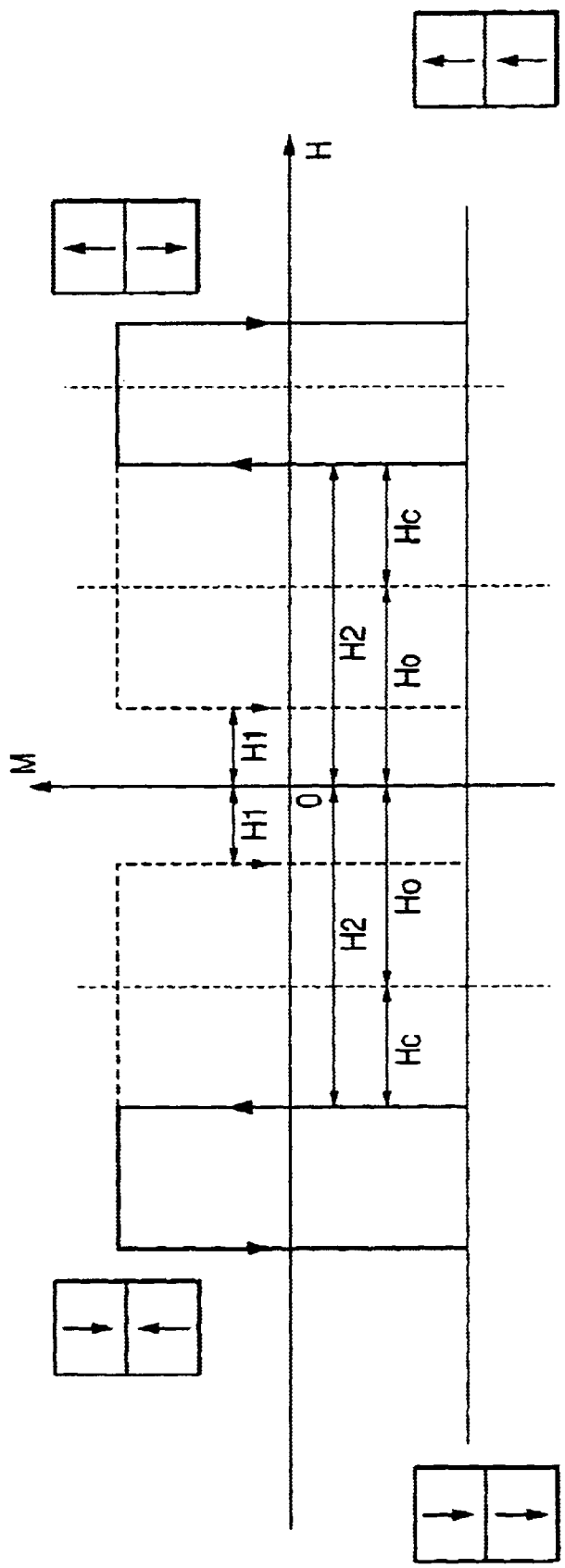
FIG. 23 is a graph showing an MH curve when the offset magnetic field is large with a squareness of 1.

FIG. 18 shows a leaked magnetic field in a conventional element different in size by 0.2 $\mu$m×0.6 $\mu$m with the same structure as that shown in FIG. 17. Even with a rectangular size, a magnetic field of about 500 Oe ($39.8 \times 10^3$ A/m) is applied at the end face. In the longitudinal magnetization film, magnetization switching is determined by spin motion in the magnetization direction. A leaked magnetic field at the end face significantly contributes to magnetization switching. For example, the leaked magnetic field assumes to increase an offset magnetic field.

Although not shown, a single-layered film formed from a perpendicular magnetization film has a magnetic field of 400 Oe ($31.8 \times 10^3$ A/m) or more at a point 1 nm above the magnetic layer 2 formed from a 0.2-$\mu$m$\square$ single-layered film of a 50-nm thick rare earth-iron family alloy in which the magnetization is 120 emu/cc. A large magnetic field is therefore applied to the magnetic layer 1 serving as a low-coercive-force layer.

(Eighth Embodiment)

The magnetoresistive element of the present invention described above adopts a magnetic field generation means for generating a perpendicular magnetic field. Information is recorded on the magnetoresistive element by using the magnetic field generation means. This magnetoresistive element can serve as a memory element. For example, as shown in FIGS. 19A and 19B, a write line 900 is arranged near the magnetoresistive element via an insulating film (not shown). The insulating film is arranged to prevent electrical contact between the magnetoresistive element and the write line.

The write line 900 extends in a direction perpendicular to the sheet surface. In FIG. 19A, a current is flowed toward the sheet surface to change the magnetization of a magnetic layer 1 upward. In FIG. 19B, a current is flowed in a front direction from the sheet surface to change the magnetization of the magnetic layer 1 downward.

As described above, the magnetoresistive element of the present invention can greatly decrease a leaked magnetic field, compared to an element using a conventional longitudinal magnetization film and an element using a conventional perpendicular magnetization film.

(Ninth Embodiment)

Figure 26A:
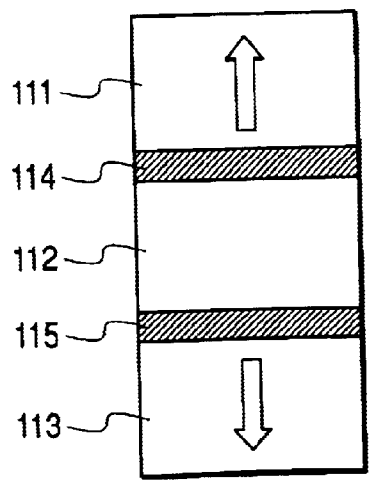
FIGS. 26A and 26B are schematic sectional views showing the structure of a magnetoresistive film according to the ninth embodiment.
Figure 26B:
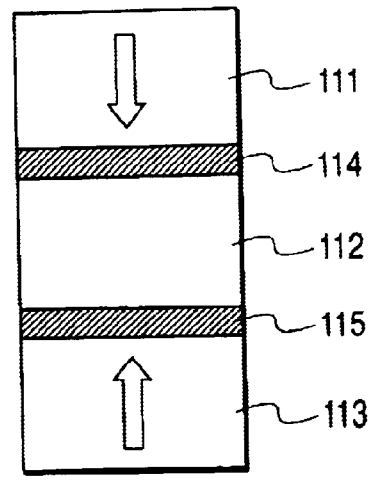

FIGS. 26A and 26B are schematic sectional views showing the structure of a magnetoresistive element according to the ninth embodiment. In the ninth embodiment, magnetic layers 111 and 113 whose magnetizations are antiparallel to each other are formed above and below a magnetic layer 112 serving as a low-coercive-force layer. The magnetoresistive element is constituted by the magnetic layers 112, 111, and 113 serving as perpendicular magnetization films. Further, a nonmagnetic conductive film 114 is interposed between the magnetic layers 112 and 111, whereas a nonmagnetic dielectric film 115 is interposed between the magnetic layers 112 and 113. The magnetization directions of the magnetic layers 111 and 113 are antiparallel to each other. In this case, the magnetic layer 111 may be magnetized upward, and the magnetic layer 113 may be magnetized downward, as shown in FIG. 26A. Alternatively, the magnetic layer 111 may be magnetized downward, and the magnetic layer 113 may be magnetized upward, as shown in FIG. 26B. Although the magnetization direction of the magnetic layer 112 is not shown, the magnetic layer 112 is magnetized upward or downward in FIGS. 26A and 26B in accordance with data written in the perpendicular magnetization film.

By setting the magnetization directions of the magnetic layers 111 and 113 antiparallel to each other, a magnetostatic coupling force acting between the magnetic layers 112 and 111 and a magnetostatic coupling force acting between the magnetic layers 112 and 111 cancel each other. The influence of a magnetic field leaked to another magnetic layer from the magnetic layer 112 whose magnetization is to be switched in recording information in the low-coercive-force layer can be reduced regardless of whether the magnetization direction of the magnetic layer 112 is to be switched from the upward direction to the downward direction or from the downward direction to the upward direction. The magnetization direction of the magnetic layer 112 can be switched upward or downward by a magnetic field having the same magnitude.

Examples of perpendicular magnetization films used as the magnetic layers 111, 112, and 113 are an artificial lattice film such as a noble metal-transition metal film, an artificial lattice film such as a CoCr or rare earth,metal-transition metal film, and an alloy of them. Of these perpendicular magnetization films, the rare earth metal-transition metal alloy can easily attain a magnetization curve having a squareness ratio of 1, and can be easily fabricated. This rare earth metal-transition metal alloy is preferable as a magnetic layer for a magnetoresistive film using a perpendicular magnetization film. The rare earth metal in the rare earth metal-transition metal alloy preferably consists of at least one element selected from the group consisting of Gd, Dy, and Tb. The transition metal preferably consists of at least one element selected from the group consisting of Co, Fe, and Ni. Especially, Gd is preferable as the rare earth metal used for the magnetic layer 112 whose magnetization switching magnetic field must be small.

Various materials can be used for the nonmagnetic conductive film 114. Many materials such as Pt, Au, Ag, Ru, Zn, Si, In, Sn, Pb, Ta, Ti, W, Cu, and Al can be adopted. Materials such as $SiO_2$ and $Al_2O_3$ can be used for the nonmagnetic dielectric film 115. $Al_2O_3$ is preferably employed because it provides a large magnetoresistance change. Information recorded on the magnetoresistive film in the ninth embodiment is read out by flowing a current perpendicular to the film surface and using a magnetoresistance generated when electrons tunnel through the nonmagnetic dielectric film 115 depending on the spin. The magnetoresistance is also changed by spin-dependent scattering which occurs at the interfaces between the nonmagnetic conductive film 114 and the magnetic layers 111 and 112 and in the magnetic layers 111 to 113. However, the magnetoresistance change by spin-dependent scattering is smaller than that caused by spin-dependent tunneling. A magnetoresistance change observed in the magnetoresistive film can be considered to be generated by spin-dependent tunneling. A magnetoresistance change by spin-dependent scattering can be ignored.

A magnetoresistive film using a rare earth metal-transition metal alloy is smaller in magnetoresistance ratio than a magnetoresistive film using only a transition metal. This is because a rare earth metal at the interface between this metal and a nonmagnetic dielectric film does not have any high spin polarizability. This magnetoresistance ratio can be increased by exchange-coupling a magnetic layer having a high spin polarizability (high-spin-polarizability magnetic layer) to a magnetic layer made of a rare earth metal and transition metal, as disclosed in EP 1,045,403. Examples of the material of the magnetic layer having a high spin polarizability are transition metals such as Fe, Co, and an alloy of them. The FeCo alloy is particularly preferable because of its high spin polarizability. Note that a transition metal thin film does not exhibit perpendicular magnetization. The magnetization must be made perpendicular to the film surface by exchange-coupling the transition metal thin film to a perpendicular magnetization film. This film structure can also be applied to the magnetoresistive film of the present invention. A magnetoresistive film based on the present invention in which such a high-spin-polarizability magnetic layer is interposed as a thin layer will be explained.

Figure 27:
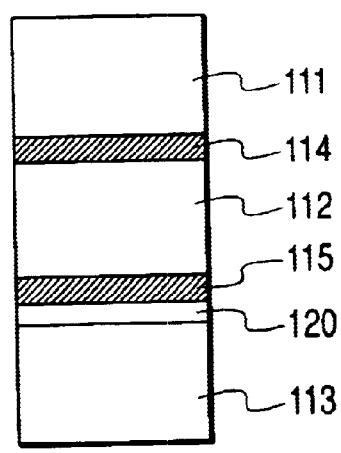
FIG. 27 is a schematic sectional view showing a film structure of a magnetoresistive film in which a high-spin-polarizability layer is inserted between a magnetic layer 113 and a nonmagnetic dielectric film 115.
Figure 28:
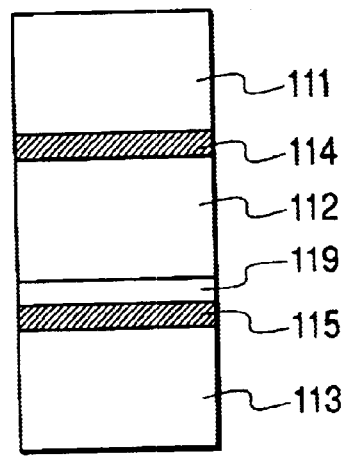
FIG. 28 is a schematic sectional view showing another film structure of the magnetoresistive film in which a high-spin-polarizability layer is inserted between a magnetic layer 112 and the nonmagnetic dielectric film 115.
Figure 29:
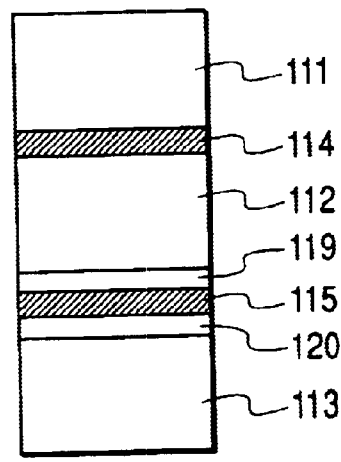
FIG. 29 is a schematic sectional view showing still another film structure of the magnetoresistive film in which high-spin-polarizability layers are inserted between the magnetic layer 112 and the nonmagnetic dielectric film 115 and between the magnetic layer 113 and the nonmagnetic dielectric film 115.

A magnetoresistive film shown in FIG. 27 is implemented by interposing a high-spin-polarizability magnetic layer 120 between the nonmagnetic dielectric film and the magnetic layer 113 in the magnetoresistive film shown in FIGS. 26A and 26B. A magnetoresistive film shown in FIG. 28 is implemented by interposing a high-spin-polarizability magnetic layer 119 between the magnetic layer 112 and the nonmagnetic dielectric film 115. In this way, the high-spin-polarizability magnetic layer can be formed at the interface between the nonmagnetic dielectric film 115 and the magnetic layer 12 or 113. Furthermore, as shown in FIG. 29, the high-spin-polarizability magnetic layers 119 and 120 can be formed on the upper and lower surfaces of the nonmagnetic dielectric film 115. Forming the high-spin-polarizability magnetic layers on the two surfaces yields a larger magnetoresistance change.

Fe, Co, or an FeCo alloy has a relatively large magnetization. When the high-spin-polarizability magnetic layer is formed at the interface of the nonmagnetic dielectric film, as described above, a magnetostatic coupling force acting on the magnetic layer 112 from these magnetic layers cannot be ignored. As a method which solves this problem, another high-spin-polarizability magnetic layer is formed at a position symmetrical about the magnetic layer 112 to the high-spin-polarizability magnetic layer arranged in contact with the nonmagnetic dielectric film. Opposite magnetostatic coupling forces from the two high-spin-polarizability magnetic layers arranged at the positions symmetrical about the magnetic layer 112 act on the magnetic layer 112. Apparently, no magnetostatic coupling force acts on the magnetic layer 112. A magnetoresistive film in which high-spin-polarizability magnetic layers are arranged at positions symmetrical about the magnetic layer 112 will be described.

Figure 30:
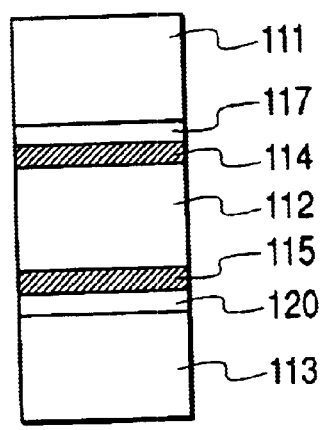
FIG. 30 is a schematic sectional view showing still another film structure of the magnetoresistive film in which high-spin-polarizability layers are inserted between a magnetic layer 111 and a nonmagnetic conductive film 114 and between the magnetic layer 113 and the nonmagnetic dielectric film 115.
Figure 31:
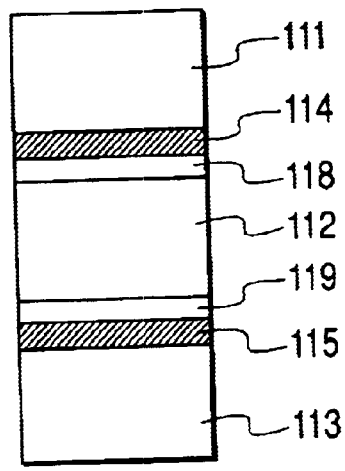
FIG. 31 is a schematic sectional view showing still another film structure of the magnetoresistive film in which high-spin-polarizability layers are inserted between the magnetic layer 112 and the nonmagnetic conductive film 114 and between the magnetic layer 112 and the nonmagnetic dielectric film 115.

In a magnetoresistive film shown in FIG. 30, a high-spin-polarizability magnetic layer 117 is interposed between the nonmagnetic conductive film 114 and the magnetic layer 111. The high-spin-polarizability magnetic layers 117 and 120 exist at positions symmetrical about the magnetic layer 112. In a magnetoresistive film shown in FIG. 31, a high-spin-polarizability magnetic layer 118 is interposed between the nonmagnetic conductive film 114 and the magnetic layer 112. The high-spin-polarizability magnetic layers 118 and 129 exist at positions symmetrical about the magnetic layer 112. In a magnetoresistive film shown in FIG. 32, the high-spin-polarizability magnetic layer 117 is interposed between the nonmagnetic conductive film 114 and the magnetic layer 111. The high-spin-polarizability magnetic layer 118 is interposed between the nonmagnetic conductive film 114 and the magnetic layer 112. The high-spin-polarizability magnetic layers 117 and 118 and the high-spin-polarizability magnetic layers 120 and 119 exist at positions symmetrical about the magnetic layer 112.

In the magnetoresistive film of the ninth embodiment, the magnetostatic coupling force between the magnetic layers 111 and 112 and that between the magnetic layers 113 and 112 must be almost equal to each other in opposite directions. This balance is preferably kept unchanged even upon a change in the temperature of the magnetoresistive film. This characteristic can be easily realized by completely similarly forming the magnetic layers 111 and 113. That is, the temperature change of the magnetization is the same between magnetic layers having the same composition. The magnetostatic coupling forces between the magnetic layers 111 and 113 and the magnetic layer 112 maintain the same balance even upon a change in temperature.

The magnetoresistive film of the ninth embodiment is used as a memory element. A means for recording information in this magnetoresistive film (memory element) and a means for reading out information recorded on the magnetoresistive film are arranged. This can implement a memory which requires a small current in write and can reduce the power consumption. A preferable example of the means for recording information is a magnetic field generated by flowing a current through wiring. A preferable example of the means for reading out recorded information is a circuit for detecting a voltage across the memory element when a constant current is flowed through the memory element.

(Tenth Embodiment)

In the tenth Embodiment, the more detailed structure of a magnetoresistive film having the structure shown in FIGS. 26A and 26B will be described. An Si wafer (silicon substrate) was used as a substrate. A $Tb_{20}(Fe_{60}Co_{40})80$ film was sputtered to a film thickness of 30 nm as a magnetic layer 113 on the substrate within a film formation vessel. A nonmagnetic dielectric film 115 was sputtered to a film thickness of 1.5 nm by using an $Al_2O_3$ target. The obtained film was plasma-oxidized in an oxygen atmosphere to compensate for oxygen atoms omitted in the nonmagnetic dielectric film 115. Accordingly, the nonmagnetic dielectric film 115 was converted into the $Al_2O_3$ composition. Evacuation was sufficiently performed, and then a 30-nm thick $Gd_{21}(Fe_{60}Co_{40})_{79}$ film as a magnetic layer 112, a 1.5-nm thick Al film as a nonmagnetic conductive film 114, a 30-nm thick $Tb_{20}(Fe_{60}Co_{40})_{80}$ film as a magnetic layer 111, and a 2-nm thick Pt film as a protective film were sequentially formed by sputtering. During formation of the magnetic layers 111 and 113, a magnetic field was applied perpendicularly to the substrate so as to magnetize the magnetic layers 111 and 113 in predetermined directions. The direction of a magnetic field applied during formation of the magnetic layer 111 and the direction of a magnetic field applied during formation of the magnetic layer 113 were antiparallel to each other. The magnetic field applied to the magnetic layer 111 was smaller in magnitude than the magnetization switching magnetic field to the magnetic layer 113, Appling such magnetic fields during film formation could make the magnetization directions of the magnetic layers 111 and 113 antiparallel to each other.

A 0.5-$\mu$m□ resist film was formed on the resultant multilayered film. A portion of the multilayered film not covered with the resist was removed by dry etching. After etching, an $Al_2O_3$ film was sputtered to a film thickness of 100 nm. The resist and the $Al_2O_3$ film on it were removed, and an insulating film for electrically insulating an upper electrode and the Si wafer was formed. An upper electrode was formed from an Al film by a lift-off method. A portion of the $Al_2O_3$ film not covered with the upper electrode was removed to form an electrode pad for connecting a measurement circuit. As a result, a magnetoresistive film was completed.

A constant current source was connected between the upper electrode and lower electrode (Si wafer) of the magnetoresistive film. A constant current was so flowed as to cause electrons to tunnel through the $Al_2O_3$ film of the nonmagnetic dielectric film 115. A magnetic field was applied perpendicularly to the film surface of the magnetoresistive film. The magnitude and direction of the magnetic field were changed to measure changes (magnetoresistance curve) in the voltage of the magnetoresistive film. Note that the magnitude of the applied magnetic field was set smaller than the magnetization switching magnetic field of the magnetic layer 111 or 113. The magnetization directions of the magnetic layers 111 and 113 were fixed, and only the magnetization direction of the magnetic layer 112 could change. The measurement results exhibited almost no observed difference in magnitude between an externally applied magnetic field when the voltage applied to the magnetoresistive film dropped and an externally applied magnetic field when the voltage rose. In other words, the phenomenon in which the magnitude of an externally applied magnetic field necessary to switch the magnetization changed depending on the magnetization switching direction owing to a magnetic field leaked from another magnetic layer, i.e., an offset magnetic field generated by a leaked magnetic field was suppressed in this magnetoresistive film.

(Eleventh Embodiment)

Figure 32:
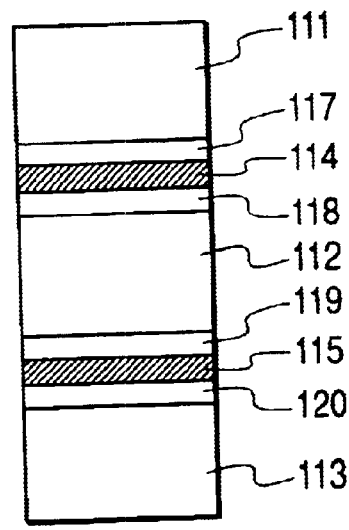
FIG. 32 is a schematic sectional view showing still another film structure of the magnetoresistive film in which high-spin-polarizability layers are inserted between the magnetic layer 111 and the nonmagnetic conductive film 114, between the magnetic layer 112 and the nonmagnetic conductive film 114, between the magnetic layer 112 and the nonmagnetic dielectric film 115, and between the magnetic layer 113 and the nonmagnetic dielectric film 115.

In the eleventh Embodiment, the structure of a magnetoresistive film having the structure shown in FIG. 32 will be described in more detail. An Si wafer (silicon substrate) was used as a substrate. A 30-nm thick $Tb_{20}(Fe_{60}Co_{40})_{80}$ film as a magnetic layer 113 and a 1-nm thick $Fe_{60}Co_{40}$ film as a high-spin-polarizability magnetic layer 120 were sequentially formed on the substrate by sputtering in a film formation vessel. A nonmagnetic dielectric film 115 was sputtered to a film thickness of 1.5 nm by using an $Al_2O_3$ target. The obtained film was plasma-oxidized in an oxygen atmosphere to compensate for oxygen atoms omitted in the nonmagnetic dielectric film 115. Accordingly, the nonmagnetic dielectric film 115 was converted into the $Al_2O_3$ composition. Evacuation was sufficiently performed, and then a 1-nm thick $Fe_{60}Co_{40}$ film as a high-spin-polarizability magnetic layer 119, a 50-nm thick $Gd_{21}(Fe_{60}Co_{40})_{79}$ film as a magnetic layer 112, a 1-nm thick $Fe_{60}Co_{40}$ film as a high-spin-polarizability magnetic layer 118, a 1.5-nm thick Al film as a nonmagnetic conductive film 114, a 1-nm thick $Fe_{60}Co_{40}$ film as a high-spin-polarizability magnetic layer 117, a 30-nm thick $Tb_{20}(Fe_{60}Co_{40})_{80}$ film as a magnetic layer 111, and a 2-nm thick Pt film as a protective film were sequentially formed by sputtering.

During formation of the magnetic layers 111 and 113, a magnetic field was applied perpendicularly to the substrate so as to magnetize the magnetic layers 111 and 113 in predetermined directions. The direction of a magnetic field applied during formation of the magnetic layer 111 and the direction of a magnetic field applied during formation of the magnetic layer 113 were antiparallel to each other. The magnetic field applied to the magnetic layer 111 was smaller in magnitude than the magnetization switching magnetic field to the magnetic layer 113. Appling such magnetic fields during film formation could make the magnetization directions of the magnetic layers 111 and 113 antiparallel to each other. The high-spin-polarizability magnetic layer 120 was exchanged-coupled to the magnetic layer 113; the high-spin-polarizability magnetic layer 117, to the magnetic layer 111; and the high-spin-polarizability magnetic layers 118 and 119, to the magnetic layer 112. The magnetizations of the high-spin-polarizability magnetic layers 117 to 120 oriented perpendicularly to the film surface. The high-spin-polarizability magnetic layers 119 and 120 were formed to obtain a high magnetoresistance ratio. The high-spin-polarizability magnetic layers 117 and 118 were magnetic layers for adjusting the magnetostatic coupling force, and did not influence the spin polarizability.

A 0.5-$\mu$m☐ resist film was formed on the resultant multilayered film. A portion of the multilayered film not covered with the resist was removed by dry etching. After etching, an $Al_2O_3$ film was sputtered to a film thickness of 120 nm. The resist and the $Al_2O_3$ film on it were removed, and an insulating film for electrically insulating an upper electrode and the Si wafer was formed. An upper electrode was formed from an Al film by a lift-off method. A portion of the $Al_2O_3$ film not covered with the upper electrode was removed to form an electrode pad for connecting a measurement circuit. As a result, a magnetoresistive film was completed.

A constant current source was connected between the upper electrode and lower electrode (Si wafer) of the magnetoresistive film. A constant current was so flowed as to cause electrons to tunnel through the $Al_2O_3$ film of the nonmagnetic dielectric film 115. A magnetic field was applied perpendicularly to the film surface of the magnetoresistive film. The magnitude and direction of the magnetic field were changed to measure changes (magnetoresistance curve) in the voltage of the magnetoresistive film. Note that the magnitude of the applied magnetic field was set smaller than the magnetization switching magnetic field of the magnetic layer 111 or 113. The magnetization directions of the magnetic layers 111 and 113 were fixed, and only the magnetization direction of the magnetic layer 112 could change. The measurement results exhibited almost no observed difference in magnitude between an externally applied magnetic field when the voltage applied to the magnetoresistive film dropped and an externally applied magnetic field when the voltage rose. In other words, the phenomenon in which the magnitude of an externally applied magnetic field necessary to switch the magnetization changed depending on the magnetization switching direction was suppressed in this magnetoresistive film.

(Twelfth Embodiment)

Figure 33:
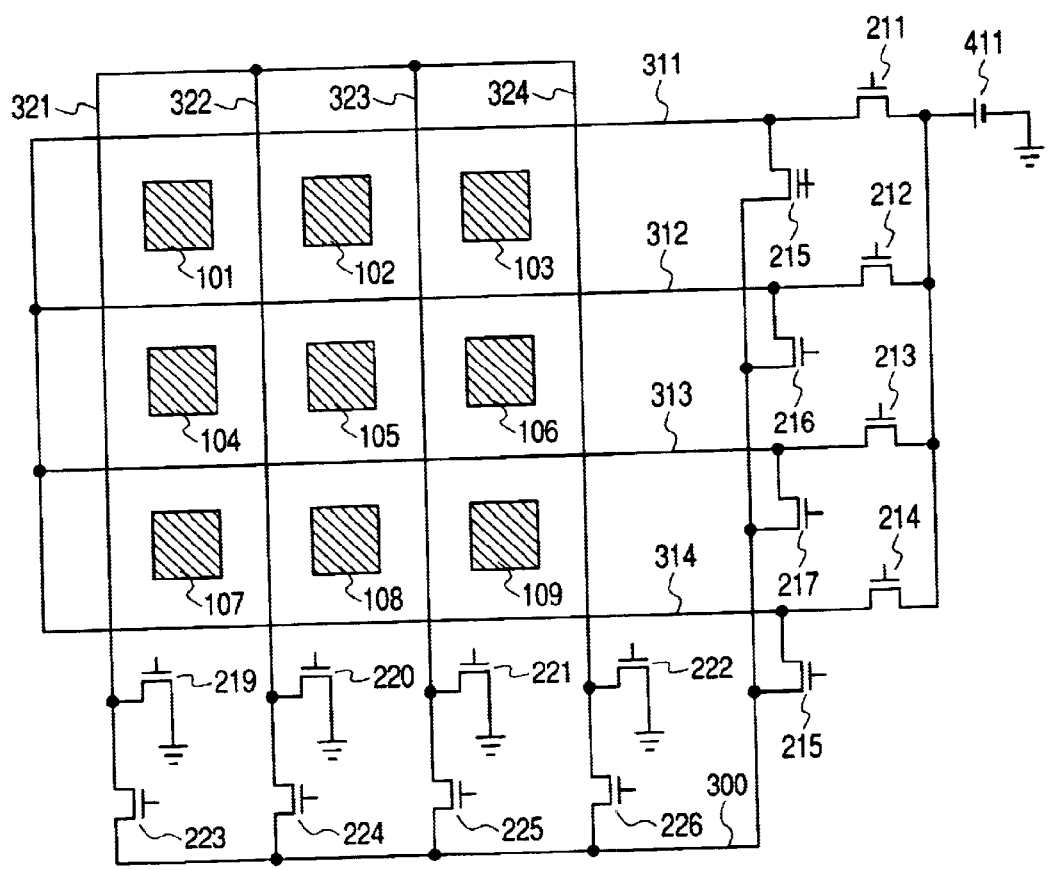
FIG. 33 is a circuit diagram showing a circuit which generates a magnetic field to be applied in order to record information and is used in the twelfth embodiment.
Figure 34:
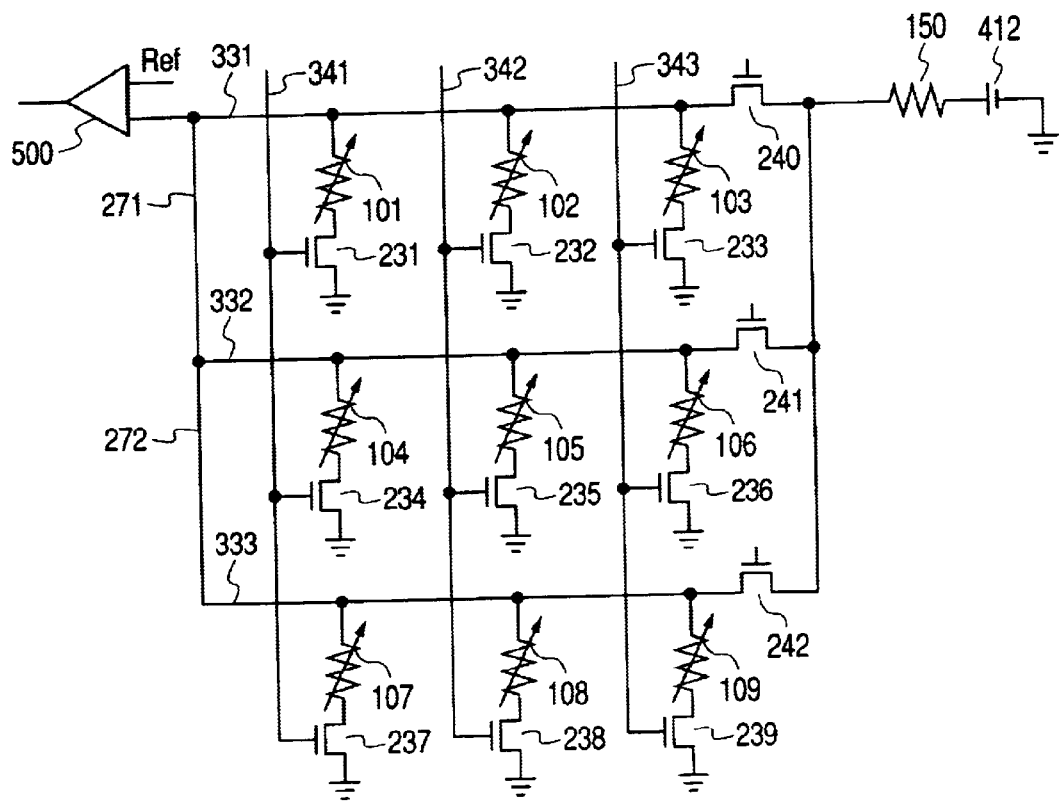
FIG. 34 is a circuit diagram showing a circuit which reads out recorded information and is used in the twelfth embodiment.

After a transistor, wiring layer, and the like were formed on an Si wafer, a magnetoresistive film having the film structure described in the above embodiment was formed. The magnetoresistive film was processed into a 3×3 array of nine memory elements, thus constituting a memory cell array. Information is recorded on the memory element by a magnetic field generated by flowing a current through a conductor. FIG. 33 shows an electric circuit for applying a recording magnetic field. FIG. 34 shows a read circuit. FIGS. 33 and 34 are plan views showing an Si wafer when viewed from above. The magnetization direction in the magnetoresistive film coincides with a direction perpendicular to the sheet surface. In practice, the arrangements shown in FIGS. 33 and 34 are formed within the memory cell array by a multilayer technique.

A method of selectively switching the magnetization of the magnetic film of a selected memory element (magnetoresistive film) will be explained.

As shown in FIG. 33, nine memory elements (magnetoresistive films) 101 to 109 are arrayed in a 3×3 matrix in the memory cell array. First write lines 311 to 314 extend in the row direction so as to sandwich respective rows of the memory elements. The left terminals of the write lines 311 to 314 in FIG. 33 are commonly connected. Their right terminals in FIG. 33 are respectively connected to transistors 211 to 214 for connecting the write lines 311 to 314 to a power supply 411, and transistors 215 to 218 for connecting the write lines 311 to 314 to a wiring line 300. Second write lines 321 to 324 extend in the column direction so as to sandwich respective columns of the memory elements. The upper terminals of the write lines 321 to 324 in FIG. 33 are commonly connected. Their lower terminals in FIG. 33 are connected to transistors 219 to 222 for grounding the write lines 321 to 324, and transistors 223 to 226 for connecting the write lines 321 to 324 to the wiring line 300.

For example, to selectively switch the magnetization of the magnetoresistive film 105, the transistors 212, 217, 225, and 220 are turned on, and the remaining transistors are turned off. Then, a current flows through the write lines 312, 313, 323, and 322 to induce magnetic fields around them. In this state, magnetic fields in the same direction are applied from the four write lines to only the magnetoresistive film 105. The remaining magnetoresistive films receive only magnetic fields in the same direction from two write lines or receive magnetic fields in opposite directions to effectively cancel the magnetic fields. The magnetic field applied to the remaining magnetoresistive films is much smaller than that applied to the magnetoresistive film 105. A combined magnetic field upon applying magnetic fields in the same direction from four write lines is adjusted to be slightly larger than the magnetization switching magnetic field of the magnetic film of a memory element (magnetoresistive film). This adjustment allows selectively switching only the magnetization of the magnetoresistive film 105. To apply magnetic fields opposite to those described above to the magnetoresistive film 105, the transistors 213, 216, 224, and 221 are turned on, and the remaining transistors are turned off. Then, a current flows through the write lines 312, 313, 323, and 322 in a direction opposite to the above-mentioned one. A magnetic field in an opposite direction is applied to the magnetoresistive film 105. Hence, the other information of binary information is recorded on the magnetoresistive film 105.

Read operation will be described. As shown in FIG. 34, one of transistors 231 to 239 for grounding memory elements are formed in series at one terminal of each of the memory elements (magnetoresistive films) 101 to 109. Bit lines 331 to 333 are formed on respective rows. The right terminals of the bit lines 331 to 333 in FIG. 34 are connected to transistors 240 to 242 for connecting the bit lines to a power supply 412 via a fixed resistor 150. The bit line 331 is connected to the other terminal of each of the magnetoresistive films 101 to 103. The bit line 332 is connected to the other terminal of each of the magnetoresistive films 104 to 106. The bit line 333 is connected to the other terminal of each of the magnetoresistive films 107 to 109. The left terminals of the bit lines 331 to 333 in FIG. 34 are commonly connected to a sense amplifier 500 for amplifying the differences between the potentials of these bit lines and a reference voltage Ref. Word lines 341 to 343 are formed on respective columns. The word line 341 is connected to the gates of the transistors 231, 234, and 237. The word line 342 is connected to the gates of the transistors 232, 235, and 238. The word line 343 is connected to the gates of the transistors 233, 236, and 239.

For example, information recorded on the magnetoresistive film 105 is to be read out. In this case, the transistors 235 and 241 are turned on to form a circuit in which the power supply 412, fixed resistor 150, and magnetoresistive film 105 are series-connected. The power supply voltage is divided into the resistances of the fixed resistor 150 and magnetoresistive film 105 at the ratio between the resistance values of the fixed resistor 150 and magnetoresistive film 105. Since the power supply voltage is fixed, a change in the resistance value of the magnetoresistive film changes the voltage applied to the magnetoresistive film. This voltage value is read out by the sense amplifier 500, thereby reading out information recorded on the magnetoresistive film 105.

Figure 35:
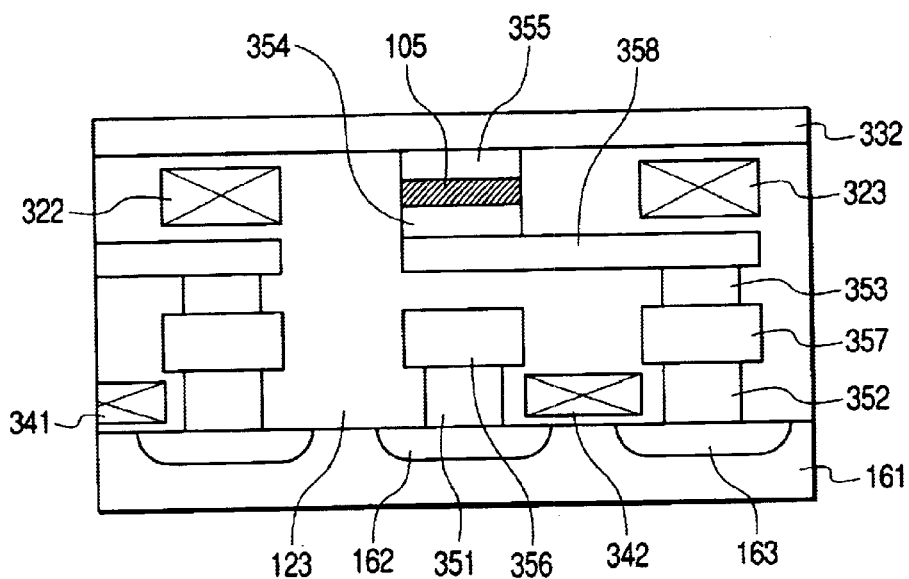
FIG. 35 is a sectional view schematically showing a memory element formed in the twelfth embodiment.

FIG. 35 schematically shows the three-dimensional structure of the 1-bit peripheral portion of this memory element. FIG. 35 shows the vicinity of the magnetoresistive film 105 in FIGS. 33 and 34. For example, two n-type diffusion regions 162 and 163 are formed in a p-type Si substrate 161. The word line 342 (gate electrode) is formed between the n-type diffusion regions 162 and 163 via an insulating layer 123. A ground wire 356 is connected to the n-type diffusion region 162 via a contact plug 351. The magnetoresistive film 105 is connected to the n-type diffusion region 163 via contact plugs 352, 353, 354, and 357 and a local wire 358. The magnetoresistive film 105 is connected to the bit line 332 via a contact plug 355. The write lines 322 and 323 for generating a magnetic field are arranged beside the magnetoresistive film 105.

(Thirteenth Embodiment)

Figure 36:
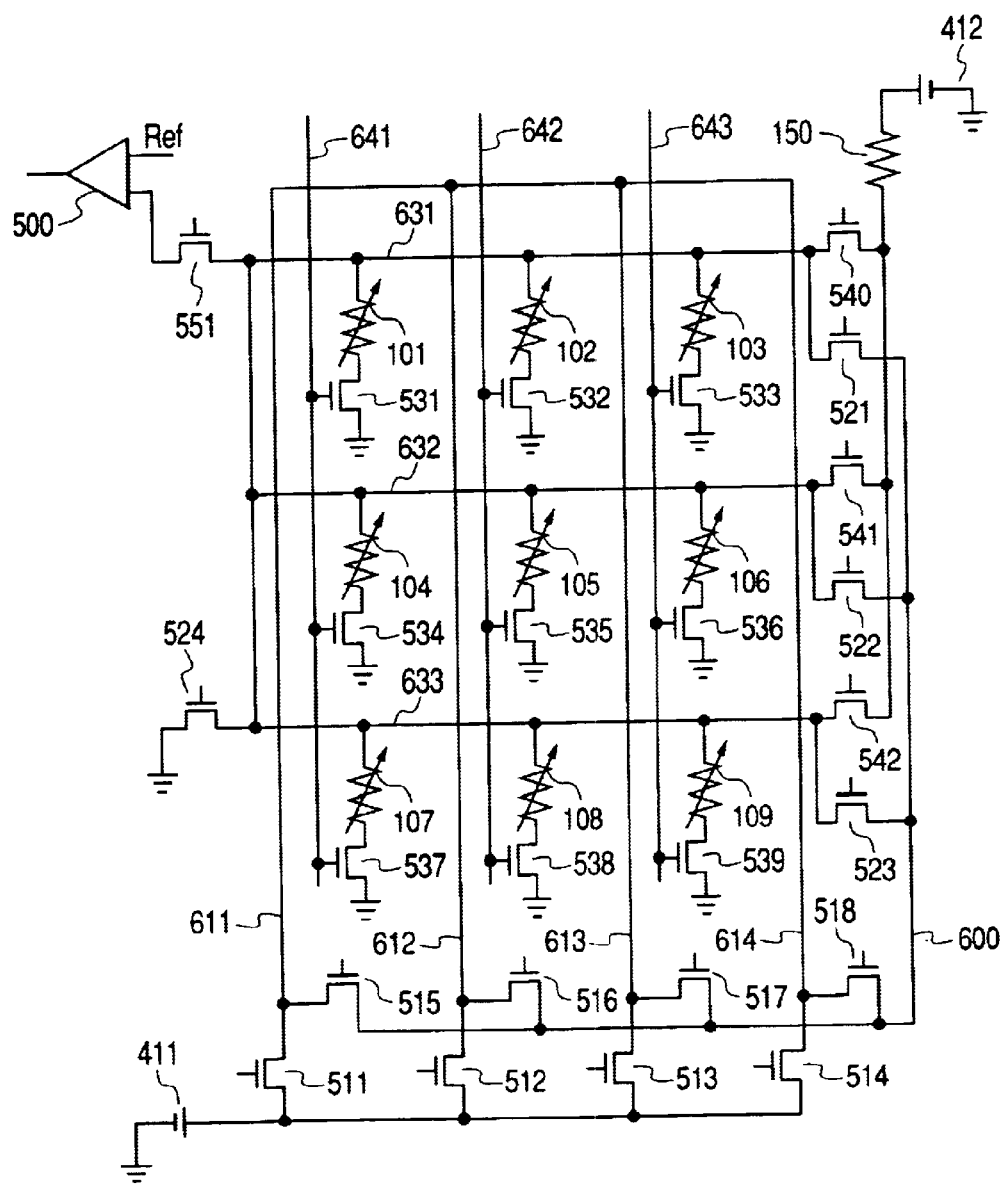
FIG. 36 is a circuit diagram showing a memory arrangement according to the thirteenth embodiment.

In the thirteenth embodiment, the magnetization is switched by applying magnetic fields to a magnetoresistive element from at least two directions, i.e., from a direction perpendicular to the film surface and a longitudinal direction when information is recorded. FIG. 36 shows a memory circuit arrangement including a memory cell array. In this memory, information is recorded by applying a longitudinal magnetic field and perpendicular magnetic field to a desired memory element. The longitudinal magnetic field is generated by flowing a current through a bit line. In the memory cell array of the eleventh Embodiment, an information write circuit and read circuit are electrically separated from each other. In the memory array described in the thirteenth embodiment, a write circuit and read circuit share a bit line.

As an arrangement for recording information, nine memory elements (magnetoresistive films) 101 to 109 are arrayed in a 3×3 matrix in the memory cell array, as shown in FIG. 36. Write lines 611 to 614 extend in the row direction so as to sandwich respective rows of the memory elements. The upper terminals of the write lines 611 to 614 in FIG. 36 are commonly connected. Their lower terminals in FIG. 36 are respectively connected to transistors 511 to 514 for connecting the write lines 611 to 614 to a power supply 411, and transistors 515 to 518 for connecting the write lines 611 to 614 to a wiring line 600.

As an arrangement for reading out information, one of transistors 531 to 539 for grounding memory elements is formed in series at one terminal of each of the memory elements (magnetoresistive films) 101 to 109. Bit lines 631 to 633 are formed on respective rows. The right terminals of the bit lines 631 to 633 in FIG. 36 are connected to transistors 540 to 542 for connecting the bit lines 631 to 633 to a power supply 412 via a fixed resistor 150, and transistors 521 to 523 for connecting the bit lines 631 to 633 to a wiring line 600. The bit line 631 is connected to the other terminal of each of the magnetoresistive films 101 to 103. The bit line 632 is connected to the other terminal of each of the magnetoresistive films 104 to 106. The bit line 633 is connected to the other terminal of each of the magnetoresistive films 107 to 109. The left terminals of the bit lines 631 to 633 in FIG. 36 are commonly connected to a sense amplifier 500 for amplifying the differences between the potentials of these bit lines and the reference voltage Ref via a transistor 551. Further, their left terminals are connected to the ground potential via a transistor 624. Word lines 641 to 643 are formed on respective columns. The word line 641 is connected to the gates of the transistors 531, 534, and 537. The word line 642 is connected to the gates of the transistors 532, 535, and 538. The word line 643 is connected to the gates of the transistors 533, 536, and 539.

A method of selectively switching the magnetization of the magnetic film of a selected memory element will be described. For example, to selectively switch the magnetization of the magnetoresistive film 105, the transistors 512, 517, 522, and 524 are turned on, and the remaining transistors are turned off. Then, a current flows through the write lines 612 and 613 to apply magnetic fields perpendicular to the film surface of the magnetoresistive film 105. A current also flows through the bit line 632, and a generated magnetic field is applied to the film surface of the magnetoresistive film 105. The magnetoresistive film 105 receives the magnetic field in the film surface and the relatively large magnetic field perpendicular to the film surface, thereby switching the magnetization of the magnetoresistive film 105. The remaining magnetoresistive films 101 to 104 and 106 to 109 do not receive any magnetic field as large as that applied to the magnetoresistive film 105. Their magnetization directions can be kept unchanged. By appropriately setting the magnitude of the current, the magnetization of only the magnetoresistive film 105 can be switched. To apply magnetic fields opposite to those described above to the magnetoresistive film 105, the transistors 513, 516, 522, and 524 are turned,on, and the remaining transistors are turned off. Then, a current flows through the bit line 632 to apply a longitudinal magnetic field to the magnetoresistive film 105. At the same time, a current in an opposite direction flows through the write lines 613 and 612 to apply a magnetic field perpendicular to the film surface to the magnetoresistive film 105. The other information of binary information is therefore recorded on the magnetoresistive film 105.

Read operation will be described. For example, information recorded on the magnetoresistive film 105 is to be read out. In this case, the transistors 535 and 541 are turned on to form a circuit in which the power supply 412, fixed resistor 150, and magnetoresistive film 105 are series-connected.

The power supply voltage is divided into the resistances of the fixed resistor 150 and magnetoresistive film 105 at the ratio between the resistance values of the fixed resistor 150 and magnetoresistive film 105. Since the power supply voltage is fixed, a change in the resistance value of the magnetoresistive film changes the voltage applied to the magnetoresistive film. This voltage value is read out by the sense amplifier 500, thereby reading out information recorded on the magnetoresistive film 105.

Comparative Example

A magnetoresistive film was constituted without forming the magnetic layer 111 in the magnetoresistive film shown in FIG. 29. An Si wafer (silicon substrate) was used as a substrate. A 30-nm thick $Tb_{20}(Fe_{60}Co_{40})_{80}$ film as a magnetic layer 113 and a 1-nm thick $Fe_{60}Co_{40}$ film as a high-spin-polarizability magnetic layer 120 were sequentially formed on the substrate by sputtering in a film formation vessel. A nonmagnetic dielectric film 115 was sputtered to a film thickness of 1.5 nm by using an $Al_2O_3$ target. The obtained film was plasma-oxidized in an oxygen atmosphere to compensate for oxygen atoms omitted in the nonmagnetic dielectric film 115. Accordingly, the nonmagnetic dielectric film 115 was converted into the $Al_2O_3$ composition. Evacuation was sufficiently performed, and then a 1-nm thick $Fe_{60}Co_{40}$ film as a high-spin-polarizability magnetic layer 119, a 50-nm thick $Gd_{21}(Fe_{60}Co_{40})_{79}$ film as a magnetic layer 112, and a 2-nm thick Pt film as a protective film were sequentially formed by sputtering. In this case, the magnetic layer 113 was formed while a magnetic field whose coercive force was smaller than that of the magnetic layer was applied to the substrate perpendicularly. The high-spin-polarizability magnetic layer 120 was exchange coupled to the magnetic layer 113; and the high-spin-polarizability magnetic layer 119, to the magnetic layer 112. The magnetizations of the high-spin-polarizability magnetic layers 119 and 120 oriented perpendicularly to the film surface. The high-spin-polarizability magnetic layers 119 and 120 were formed to obtain a high magnetoresistance ratio.

A 0.5-$\mu$m□ resist film was formed on the resultant multilayered film. A portion of the multilayered film not covered with the resist was removed by dry etching. After etching, an $Al_2O_3$ film was sputtered to a film thickness of 90 nm. The resist and the $Al_2O_3$ film on it were removed, and an insulating film for electrically insulating an upper electrode and the Si wafer was formed. An upper electrode was formed from an Al film by a lift-off method. A portion of the $Al_2O_3$ film not covered with the upper electrode was removed to form an electrode pad for connecting a measurement circuit. As a result, a magnetoresistive film of the comparative example was completed.

A constant current source was connected between the upper electrode and lower electrode (Si wafer) of the magnetoresistive film. A constant current was so flowed as to cause electrons to tunnel through the $Al_2O_3$ film of the nonmagnetic dielectric film 115. A magnetic field was applied perpendicularly to the film surface of the magnetoresistive film. The magnitude and direction of the magnetic field were changed to measure changes (magnetoresistance curve) in the voltage of the magnetoresistive film. The measurement results exhibited that an externally applied magnetic field when the voltage applied to the magnetoresistive film dropped was smaller in magnitude by about 1.5 kA/m than an externally applied magnetic field when the voltage rose. That is, this magnetoresistive film suffered the phenomenon in which the magnitude of an externally applied magnetic field necessary to switch the magnetization changed depending on the magnetization switching direction, i.e., an offset magnetic field generated under the influence of a magnetic field leaked from the magnetic layer 113 serving as a high-coercive-force magnetic layer.

(Fourteenth Embodiment)

Figure 37A:
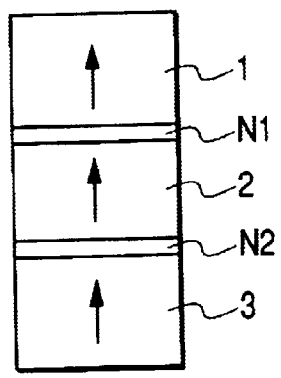
FIGS. 37A and 37B are sectional views showing a magnetoresistive element according to the fourteenth embodiment.
Figure 37B:
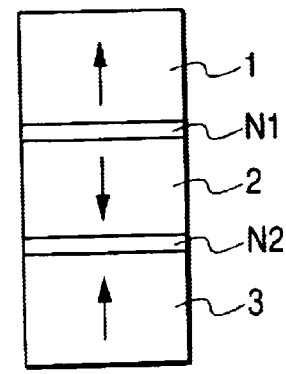

FIGS. 37A and 37B show an example of a magnetoresistive element according to the fourteenth embodiment. A perpendicular magnetization film generally has a small demagnetizing energy, and has a smaller magnetization magnitude than that of a longitudinal magnetization film. This perpendicular magnetization film is used for a magnetic layer to form a double tunneling magnetoresistive element. In this case, the magnitude of a magnetic field applied by the magnetization of each stacked magnetic layer to another magnetic layer can be decreased. In particular, a magnetic field leaked from a high-coercive-force magnetic layer to a low-coercive-force magnetic layer can be reduced. An antiparallel magnetization state can be easily realized. In addition, the shift amount by an offset magnetic field which offsets the MH curve by a leaked magnetic field can be decreased. Reduction in shift magnetic field (offset magnetic field) means suppression of an increase in switching magnetic field. The use of this magnetoresistive element as the memory element of an MRAM can suppress the power consumption and can also suppress erroneous write to an adjacent memory cell. In FIGS. 37A and 37B, arrows indicate the magnetization directions of magnetic layers. FIGS. 37A and 37B show two stable magnetization states of the magnetoresistive element.

The magnetoresistive element is fabricated by sequentially stacking a magnetic layer 111 magnetized perpendicularly to the film surface, a first nonmagnetic layer N1, a magnetic layer 112 magnetized perpendicularly to the film surface, a second nonmagnetic layer N2, and a magnetic layer 113 magnetized perpendicularly to the film surface. In the state of FIG. 37A, all the magnetic layers are magnetized upward. In the state of FIG. 37B, only the magnetic layer 112 is magnetized downward. The nonmagnetic layers N1 and N2 are formed from insulating layers. The nonmagnetic layers N1 and N2 are thick enough to flow a tunneling current, and the tunnel resistance value changes depending on the spin tunneling effect. In this case, the two nonmagnetic layers are adopted as insulating layers, and each magnetic layer is formed from a perpendicular magnetization film. This magnetoresistive element can be regarded as a double tunneling perpendicular magnetization MR element. When a current is flowed in the direction of film thickness of this element, the resistance is small in the state of FIG. 37A because magnetizations are parallel to each other, but large in the state of FIG. 37B because the magnetizations of the magnetic layers 111 and 112 are antiparallel to each other and those of the magnetic layers 112 and 113 are also antiparallel to each other.

In a TMR element including two insulating layers, like the fourteenth embodiment, a voltage ½ the voltage applied to the top and bottom of the element is applied to each insulating layer. From this, it is more preferable for the memory element of the MRAM to reduce the bias voltage dependency of the MR ratio and suppress a decrease in MR ratio.

A magnetization state in which only the magnetization direction of the magnetic layer 112 changes, as shown in FIG. 37B, can be realized by setting the coercive forces of the magnetic layers 111 and 113 higher than that of the magnetic layer 112. More specifically, a magnetic field larger than the coercive forces of the magnetic layers 111 and 113 is applied to the element to align the directions of these magnetic layers. After that, a smaller magnetic field is applied to change the magnetization direction of the magnetic layer 112. In this element, the element resistance value by the spin tunneling effect can be increased/decreased by changing the magnetization direction of the magnetic layer 112 by an external magnetic field.

The magnetic layers 111 and 113 are magnetized in the same direction, and the magnetization direction of the magnetic layer 112 is changed in accordance with recording information. In read, the resistance value is detected. In this manner, the magnetoresistive element can function as a memory element.

Figure 38A:
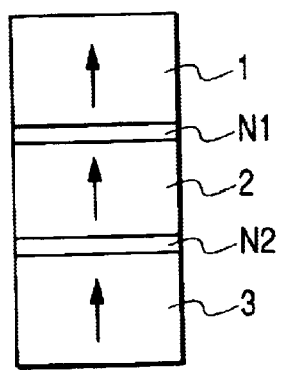
FIGS. 38A and 38B are sectional views showing the magnetization state of the magnetoresistive element according to the fourteenth embodiment.
Figure 38B:
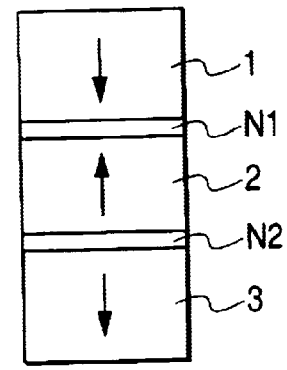

To the contrary, if the coercive forces of the magnetic layers 111 and 113 are set smaller than that of the magnetic layer 112, the magnetization directions of the magnetic layers 111 and 113 can be changed by an external magnetic field while the magnetization direction of the magnetic layer 112 is fixed, as shown in FIGS. 38A and 38B. This can realize a low-resistance state shown in FIG. 38A and a high-resistance state shown in FIG. 38B.

The magnetization directions of the magnetic layers 111 and 113 may be changed in accordance with recording information, and the magnetization direction of the magnetic layer 112 may be switched in read. In this fashion, the magnetoresistive element functions as a memory element. More specifically, the coercive forces of the magnetic layers 111 and 113 are set higher than that of the magnetic layer 112, and information is read out by the differential detection method. FIGS. 39A1, 39A2, 39B1 and 39B2 show examples of the magnetization state at this time. In FIGS. 39A1 and 39A2, the magnetic layers 111 and 113 are magnetized upward, and information corresponding to "1" is recorded. In FIGS. 39B1 and 39B2, the magnetic layers 111 and 113 are magnetized downward, and information corresponding to "0" is recorded. These two magnetization directions correspond to binary data "0" and "1". The difference between FIGS. 39A1 and 39A2 is the magnetization direction of the magnetic layer 112. The difference between FIGS. 39B1 and 39B2 is also the magnetization direction of the magnetic layer 112. In any case, in reproducing information, an upward magnetic field is applied to the element, and then a downward magnetic field is applied. The magnetic field at this time is set larger than the coercive force of the magnetic layer 112 and smaller than the coercive forces of the magnetic layers 111 and 113 so as to switch only the magnetization of the magnetic layer 112. When information is recorded by magnetizing the magnetic layers 111 and 113 upward, the resistance changes from a high resistance to a low resistance. When information is recorded by magnetizing the magnetic layers 111 and 113 downward, the resistance changes from a low resistance to a high resistance. Such a change in resistance can be sensed to read out recorded information.

Alternatively, the magnetization direction of the magnetic layer 112 may be fixed, the magnetization directions of the magnetic layers 111 and 113 may be changed in accordance with recording information, and the resistance value may be detected in read. Also in this case, the magnetoresistive element functions as a memory element.

This example is shown in FIGS. 40A1, 40A2, 40B1 and 40B2. FIGS. 40A1 and 40A2 show a state in which the magnetic layer 112 is magnetized upward. In FIGS. 40B1 and 40B2, information is recorded by magnetizing the magnetic layer 112 downward. The states of FIGS. 40A1 and 40A2 correspond to one of binary data "0" and "1", whereas the states of FIGS. 40B1 and 40B2 correspond to the other one.

Also in this example, an upward magnetic field is applied to the element, and then a downward magnetic field is applied. The magnetic field at this time is set smaller than the coercive force of the magnetic layer 112 and larger than the coercive forces of the magnetic layers 111 and 113 so as to switch the magnetizations of the magnetic layers 111 and 113 without switching the magnetization of the magnetic layer 112. A change in resistance value can be sensed to read out recorded information.

(Fifteenth Embodiment)

Figure 41A:
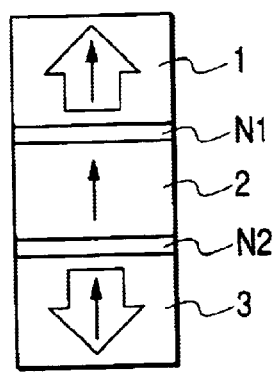
FIGS. 41A and 41B are sectional views for explaining the magnetization state of a magnetoresistive element according to the fifteenth embodiment.
Figure 41B:
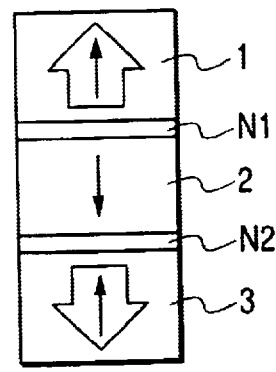

In the structure of the fourteenth embodiment, magnetic layers 111 and 113 are formed from a ferrimagnet made of a rare earth-transition metal alloy. The combined magnetization directions of the magnetic layers 111 and 113 are made antiparallel to each other. This structure can reduce a magnetic field leaked to a magnetic layer 112, and can more preferably reduce the bias dependency of the MR ratio. FIGS. 41A and 41B show this element structure. In FIGS. 41A and 41B, of arrows in the magnetic layers 111 and 113, each outer outline arrow represents the combined magnetization direction of the entire magnetic layer including the sublattice magnetizations of the rare earth element and transition metal. Each inner black solid line arrow represents the sublattice magnetization direction of the transition metal which influences the magneto-resistance effect.

For example, a magnetoresistive element is prepared by forming the magnetic layer 111 from a rare earth-iron family alloy film in which the sublattice magnetization of the iron family element is dominant, and the magnetic layer 113 from a rare earth-iron family alloy film in which the sublattice magnetization of the rare earth element is dominant. The rare earth-iron family alloy film is a ferrimagnet in which the sublattice magnetizations of the rare earth element and iron family element are antiparallel to each other. The net magnetization is the difference between these sublattice magnetizations. The sublattice magnetization of the iron family element is mainly caused by the magnetoresistance. The net magnetization and the magnetization direction caused by the magnetoresistance can be made antiparallel to each other by adjusting one magnetic layer to a composition in which the sublattice magnetization of the iron family element is dominant and the other magnetic layer to a composition in which the sublattice magnetization of the rare earth element is dominant.

Alternatively, the magnetic layer 111 may be set to a composition in which the sublattice magnetization of the rare earth element is dominant, whereas the magnetic layer 113 may be set to a composition in which the sublattice magnetization of the iron family element is dominant.

Nonmagnetic layers N1 and N2 can be made of a good conductor such as Cu so as to generate a GMR effect (Giant Magneto-resistance effect), or an insulator such as $Al_2O_3$ so as to generate a spin tunneling effect. The spin tunneling effect exhibits a magnetoresistance ratio higher than that of the GMR effect, and allows setting a resistance value suitable for the memory cell of an MRAM. It is preferable to cause the spin tunneling effect. That is, both the first nonmagnetic layer N1 and second nonmagnetic layer N2 are desirably made of an insulating layer.

Any material film can be used as far as the film is magnetized perpendicularly to the film surface and generates the magneto-resistance effect. Examples of such a film are the above-described rare earth-iron family alloy film, a CoCr alloy film, and a garnet film. Of these materials, the rare earth-iron family alloy is preferable because this alloy is easily changed into a perpendicular magnetization film at room temperature after film formation and is free from any adverse effect of the crystal grain boundary. All the magnetic layers 111, 112, and 113 are preferably formed from a ferrimagnetic film made of an alloy of a rare earth element and iron family element.

Examples of the rare earth-iron family alloy film are GdFe, GdFeCo, TbFe, TbFeCo, DyFe, and DyFeCo. The perpendicular magnetic anisotropies of these magnetic films become larger as the films contain Gd, Dy, and Tb in an order named. For a layer having a high coercive force, TbFe or TbFeCo is preferably employed. For a layer having a low coercive force, GdFe or GdFeCo is preferably adopted.

The film thickness of each magnetic layer desirably falls within the range of 2 nm to 1 $\mu$m. This is because a film thinner than 2 nm is difficult to maintain its magnetization in one direction. A film thicker than 1 $\mu$m is difficult to process, and its roughness increases to short-circuit a tunnel barrier film. Since problems arise in the manufacturing process in this manner, the film thickness is preferably 100 nm or less, and more preferably 5 nm or more to 50 nm or less.

Figure 42A:
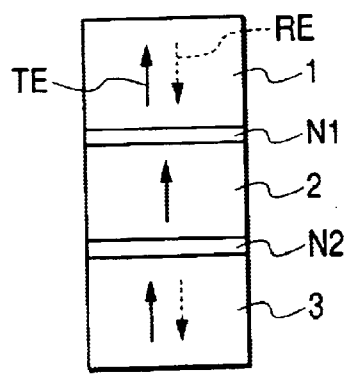
FIGS. 42A and 42B are sectional views showing another example of the magnetization state of the magnetoresistive element according to the fifteenth embodiment.
Figure 42B:
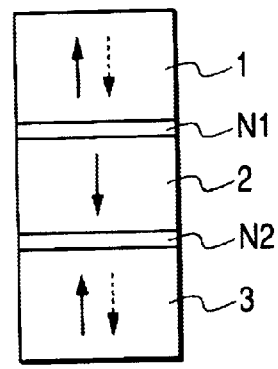

FIGS. 42A and 42B show the magnetization state of a magnetoresistive element using a ferrimagnetic film made of an alloy of a rare earth element and iron family element. Each solid line in the magnetic layers 111 and 113 represents the sublattice magnetization direction of the iron family element (TE); each dotted line, the sublattice magnetization direction of the rare earth element (RE). FIGS. 42A and 42B show a case in which the coercive forces of the magnetic layers 111 and 113 are higher than that of the magnetic layer 112, the magnetization directions of the magnetic layers 111 and 113 are fixed, and the magnetization direction of the magnetic layer 112 is switched.

As for the exchange coupling force, the coupling force of the iron family element is stronger than that of the rare earth element. The iron family element mainly contributes to the exchange coupling force between the magnetic layers. In FIG. 42A, the sublattice magnetizations of the iron family element are parallel, and the resistance is low with the spin tunneling effect. In FIG. 42B, the magnetization state between the magnetic layers 111 and 112 and that between the magnetic layers 112 and 113 are antiparallel to each other, and the resistance is high.

Figure 43A:
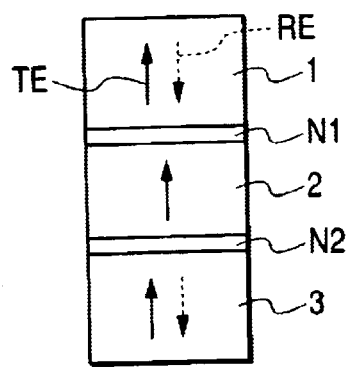
FIGS. 43A and 43B are sectional views showing still another example of the magnetization state of the magnetoresistive element according to the fifteenth embodiment.
Figure 43B:
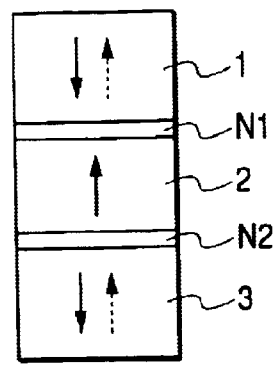

FIGS. 43A and 43B show a case wherein the coercive force of the magnetic layer 112 is high, its magnetization direction is fixed, and the magnetizations of the magnetic layers 111 and 113 are switched.

In the fifteenth embodiment, all the magnetic layers 111, 112, and 113 are preferably formed from a ferrimagnetic film made of an alloy of a rare earth element and iron family element.

As described above, magnetic layers having a high spin polarizability are formed on the two sides of a nonmagnetic layer in order to enhance the magnetoresistance effect, and particularly the spin tunneling effect and increase the magnetoresistance ratio. For the spin tunneling effect, a magnetic film which increases the magnetoresistance ratio means a film having a high spin polarizability. A magnetic layer having a high spin polarizability is desirably formed on at least one portion between each magnetic layer and a corresponding nonmagnetic layer.

Magnetic coupling includes exchange coupling and magnetostatic coupling. Of these couplings, exchange coupling uniformly acts in the film surface without forming a nonmagnetic layer between magnetic layers. Exchange coupling is more desirable as magnetic coupling.

The film thickness of the magnetic layer having a high spin polarizability falls within the range of 10 nm in atomic order, and preferably within the range of 1 nm to 5 nm.

Examples of the material having a high spin polarizability are ferromagnetic materials such as Fe, Co, and FeCo. These materials have a property that they are easily magnetized within the film surface by a demagnetizing field because of large magnetization. A thinner film is more easily magnetized perpendicularly in order to exchange-couple the magnetic layers 111, 112, and 113 and perpendicularly magnetize them.

Figure 44:
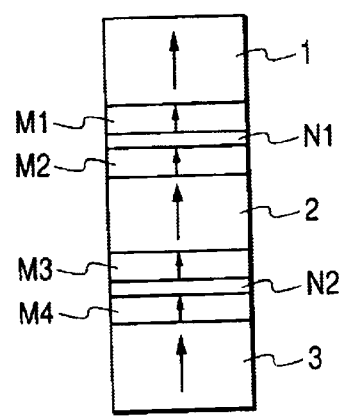
FIG. 44 is a sectional view showing another example of the magnetoresistive element according to the fifteenth embodiment.

FIG. 44 shows a magnetoresistive element with such a magnetic layer having a high spin polarizability. This magnetoresistive element is constituted by forming a high-spin-polarizability material layer M1 between the magnetic layer 111 and the first nonmagnetic layer N1, a high-spin-polarizability material layer M2 between the first nonmagnetic layer N1 and the magnetic layer 112, a high-spin-polarizability material layer M3 between the magnetic layer 112 and the second nonmagnetic layer N2, and a high-spin-polarizability material layer M4 between the second nonmagnetic layer N2 and the magnetic layer 113.

As the high-spin-polarizability material layers M1 to M4, layers of Co, Fe, CoFe, and the like can be adopted. Of these materials, CoFe preferably achieves a high MR ratio. When these materials are singly used for film formation, the resultant film is a longitudinal magnetization film. It is, therefore, preferable to form a thin film from such a material, exchange-couple this film to the magnetic layer 111, 112, or 113, and obtain a perpendicular magnetization film.

(Sixteenth Embodiment)

Figure 45A:
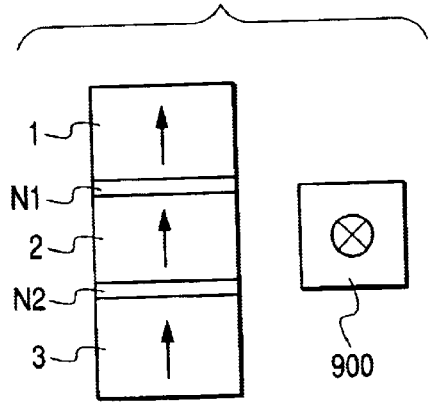
FIGS. 45A and 45B are sectional views showing the relationship between a memory element and a write line according to the sixteenth embodiment.
Figure 45B:
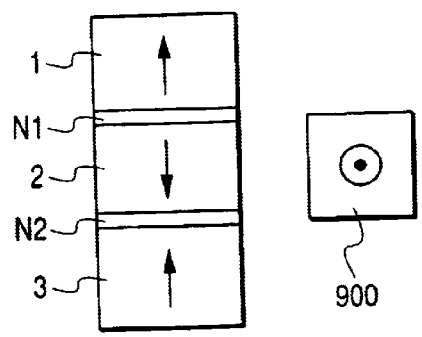

The magnetoresistive element of each of the above-described embodiments based on the present invention adopts a magnetic field generation means for generating a perpendicular magnetic field. Information is recorded on the magnetoresistive element by using the magnetic field generation means. This magnetoresistive element can serve as a memory element. For example, as shown in FIGS. 45A and 45B, a write line 900 is arranged near the magnetoresistive element via an insulating film (not shown). The insulating film is arranged to prevent electrical contact between the magnetoresistive element and the write line.

The write line 900 extends in a direction perpendicular to the sheet surface. In FIG. 45A, a current is flowed toward the sheet surface to change the magnetization of a magnetic layer 2 upward. In FIG. 45B, a current is flowed in a front direction from the sheet surface to change the magnetization of the magnetic layer 2 downward.

To constitute a memory device (MRAM), memory cells formed from memory elements described above are arrayed in a matrix. A switching element is preferably disposed to prevent crosstalk between memory elements.

Figure 46:
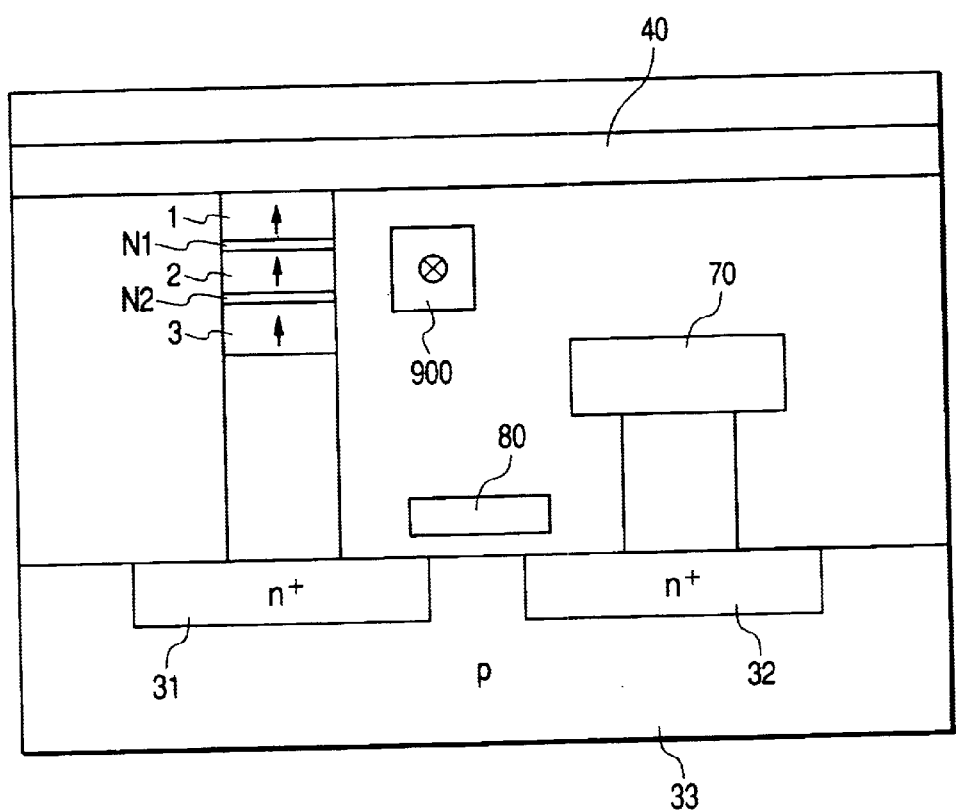
FIG. 46 is a sectional view showing an example of a memory arrangement according to the sixteenth embodiment.

FIG. 46 shows a memory cell array having a switching element. FIG. 46 shows only one of memory cells in the memory cell array. In practice, identical memory cells are aligned in the lateral direction and direction of depth in FIG. 46, and are arrayed in a matrix when viewed from above.

In FIG. 46, one terminal of a magnetoresistive element is connected to a drain region 31 in a MOSFET (Metal Oxide Semiconductor Field Effect Transistor) made up of a gate electrode 80, and source and drain regions 32 and 31 which are n+-type regions formed in a silicon semiconductor p-type substrate 33. The other terminal of the magnetoresistive element is connected to a sense line 40.

In writing/erasing recording information, currents are flowed through the write line 900 extending perpendicularly to the sheet surface and the bit line 40 extending along the sheet surface. As a result, information can be recorded at a magnetoresistive element (memory cell) positioned at the intersection between these lines. An electrode 70 connected to the source region 32 is grounded. A current source and sense circuit are respectively arranged on the left and right sides of the sense line 40. This allows applying a potential corresponding to the resistance value of the magnetoresistive element to the sense circuit, thus detecting information. The sixteenth embodiment can also employ the magnetoresistive element as the memory element of an MRAM having equivalent circuits described with reference to FIGS. 33, 34, and 36.

What is claimed is:

1. A magnetoresistive element comprising:
   a first magnetic layer magnetized perpendicularly to a film plane;
   a second magnetic layer which is magnetized perpendicularly to the film surface and has a coercive force higher than a coercive force of said first magnetic layer;
   a nonmagnetic layer inserted between said first and second magnetic layers; and
   a third magnetic layer which has a coercive force higher than the coercive force of said first magnetic layer and is magnetized antiparallel to said second magnetic layer.

2. An element according to claim 1, wherein at least one of said second and third magnetic layers includes a ferrimagnetic layer.

3. An element according to claim 1, wherein at least said first magnetic layer, said nonmagnetic layer, said second magnetic layer, and said third magnetic layer are formed in this order.

4. An element according to claim 3, wherein said second magnetic layer includes a ferrimagnetic film of a rare earth-iron family element alloy in which a sublattice magnetization of an iron family element is dominant, and said third magnetic layer includes a ferrimagnetic film of a rare earth-iron family element alloy in which a sublattice magnetization of a rare earth element is dominant.

5. An element according to claim 3, wherein said second magnetic layer includes a ferromagnetic film containing an iron family element as a main component, and said third magnetic layer includes a ferrimagnetic film of a rare earth-iron family element alloy in which a sublattice magnetization of a rare earth element is dominant.

6. An element according to claim 2, wherein the ferrimagnetic layer essentially consists of at least one rare earth element selected from the group consisting of Gd, Tb, and Dy and at least one material selected from the group consisting of Fe and Co.

7. An element according to claim 1, wherein said first magnetic layer comprises said first magnetic layer and another layer, the other layer having a spin polarizability higher than a spin polarizability of said first magnetic layer, and wherein the other layer is positioned between said first magnetic layer and said nonmagnetic layer.

8. An element according to claim 7, wherein said first magnetic layer includes a ferrimagnetic film of a rare earth-iron family element alloy in which a sublattice magnetization of an iron family element is dominant, and the magnetic layer having a high spin polarizability includes a ferromagnetic film containing an iron family element as a main component.

9. An element according to claim 1, wherein a combined magnetic field applied from said second and third magnetic layers to said first magnetic layer is smaller in coercive force than said first magnetic layer.

10. An element according to claim 1, wherein said nonmagnetic layer includes an insulating layer.

11. A memory element comprising:
    said magnetoresistive element defined in claim 1; and
    magnetic field generation means for generating a magnetic field perpendicular to a film surface of said magnetoresistive element,
    wherein information is recorded on said magnetoresistive element by using said magnetic field generation means.

12. An MRAM comprising:
    a substrate;
    a plurality of memory elements defined in claim 11 on said substrate;
    a plurality of switching elements each having one terminal connected to one terminal of a corresponding one of said memory elements; and
    a plurality of bit lines which are connected to said memory elements and read out information recorded by said magnetic field generation means.

13. A recording/reproduction method for said MRAM defined in claim 12, comprising the steps of fixing magnetizations of said second and third magnetic layers of said memory element, changing a magnetization direction of said first magnetic layer to record information, and reading out a resistance value depending on the magnetization direction of said first magnetic layer to reproduce the information.

* * * * *

UNITED STATES PATENT AND TRADEMARK OFFICE
CERTIFICATE OF CORRECTION

PATENT NO. : 6,713,830 B2
DATED : March 30, 2004
INVENTOR(S) : Naoki Nishimura et al.

It is certified that error appears in the above-identified patent and that said Letters Patent is hereby corrected as shown below:

Title page,
Item [56], References Cited, U.S. PATENT DOCUMENTS, the following should be inserted:
-- 6,055,179    4/2000    Koganei, et al.   ...........365/158
   6,219,275 B1  4/2001    Nishimura        ..........365/173
   6,104,632    8/2000    Nishimura        ..........365/158 --.
FOREIGN PATENT DOCUMENTS,
-- EP   1 045 503 A2 10/2000 -- should be inserted.

Column 1,
Line 15, "receive" should read -- have been receiving --.

Column 3,
Line 26, "M Ms," should read --M=MS, --.

Column 4,
Line 2, "comprising" should be -- comprising: --.

Column 5,
Line 12, "in a" should read -- in an --.

Column 8,
Line 25, "of,the" should read -- of the --.
Line 44, "alloy" should read -- alloys --.

Column 9,
Line 37, "magnetic" should read -- a magnetic --.

Column 13,
Line 49, "earth,metal-transition" should read -- earth metal-transition --.

Column 16,
Line 11, "113, Appling" should read -- 113. Applying --.

Column 17,
Line 17, "Appling" should read -- Applying --.

UNITED STATES PATENT AND TRADEMARK OFFICE
CERTIFICATE OF CORRECTION

PATENT NO. : 6,713,830 B2
DATED : March 30, 2004
INVENTOR(S) : Naoki Nishimura et al.

It is certified that error appears in the above-identified patent and that said Letters Patent is hereby corrected as shown below:

<u>Column 20,</u>
Line 54, "turned,on" should read -- turned on, --.

Signed and Sealed this

Seventh Day of December, 2004

JON W. DUDAS
*Director of the United States Patent and Trademark Office*